(12) United States Patent
Lee et al.

(10) Patent No.: US 11,859,276 B2
(45) Date of Patent: Jan. 2, 2024

(54) MASK FRAME AND METHOD OF MANUFACTURING THE SAME

(71) Applicant: Samsung Display Co., LTD., Yongin-si (KR)

(72) Inventors: Jongyoon Lee, Hanam-si (KR); Seungjin Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/528,123

(22) Filed: Nov. 16, 2021

(65) Prior Publication Data

US 2022/0195592 A1 Jun. 23, 2022

(30) Foreign Application Priority Data

Dec. 21, 2020 (KR) .................. 10-2020-0180082

(51) Int. Cl.
*C23C 16/04* (2006.01)
*C23C 14/04* (2006.01)
*B05C 21/00* (2006.01)

(52) U.S. Cl.
CPC .......... *C23C 16/042* (2013.01); *B05C 21/005* (2013.01)

(58) Field of Classification Search
None
See application file for complete search history.

(56) References Cited

U.S. PATENT DOCUMENTS

| 9,141,001 | B2* | 9/2015 | Kim | G03F 7/70733 |
| 9,581,917 | B2* | 2/2017 | Bucci | C23C 14/042 |
| 9,657,392 | B2* | 5/2017 | Han | B05C 21/005 |
| 10,236,475 | B2 | 3/2019 | Kim | |
| 10,625,289 | B2 | 4/2020 | Gong et al. | |
| 11,396,697 | B2* | 7/2022 | Oudes | C23C 16/042 |
| 11,479,851 | B2* | 10/2022 | Jakob | C23C 16/042 |
| 2009/0260566 | A1* | 10/2009 | Landgraf | G03F 7/12 118/504 |
| 2011/0185561 | A1* | 8/2011 | Landgraf | G03F 7/12 29/446 |
| 2013/0318774 | A1* | 12/2013 | Kang | C23C 14/042 254/133 R |
| 2016/0310988 | A1 | 10/2016 | Lee et al. | |
| 2016/0369389 | A1 | 12/2016 | Ko et al. | |
| 2020/0232091 | A1* | 7/2020 | Ahn | C23C 16/042 |

FOREIGN PATENT DOCUMENTS

| KR | 10-2016-0127888 | 11/2016 |
| KR | 10-2017-0000058 | 1/2017 |
| KR | 10-2017-0141854 | 12/2017 |
| KR | 10-2018-0030315 | 3/2018 |
| KR | 10-2019-0140768 | 12/2019 |
| KR | 10-2019-0140771 | 12/2019 |
| KR | 10-2080297 | 2/2020 |

* cited by examiner

*Primary Examiner* — Jethro M. Pence
(74) *Attorney, Agent, or Firm* — H.C. Park & Associates, PLC

(57) ABSTRACT

A mask frame includes a first horizontal portion, a second horizontal portion disposed under the first horizontal portion, at least one vertical portion connecting the first horizontal portion and the second horizontal portion and a tensile bar coupled to the first horizontal portion, and the tensile bar is configured to apply a contraction force to the first horizontal portion in a longitudinal direction of the tensile bar.

11 Claims, 19 Drawing Sheets

FIG. 17
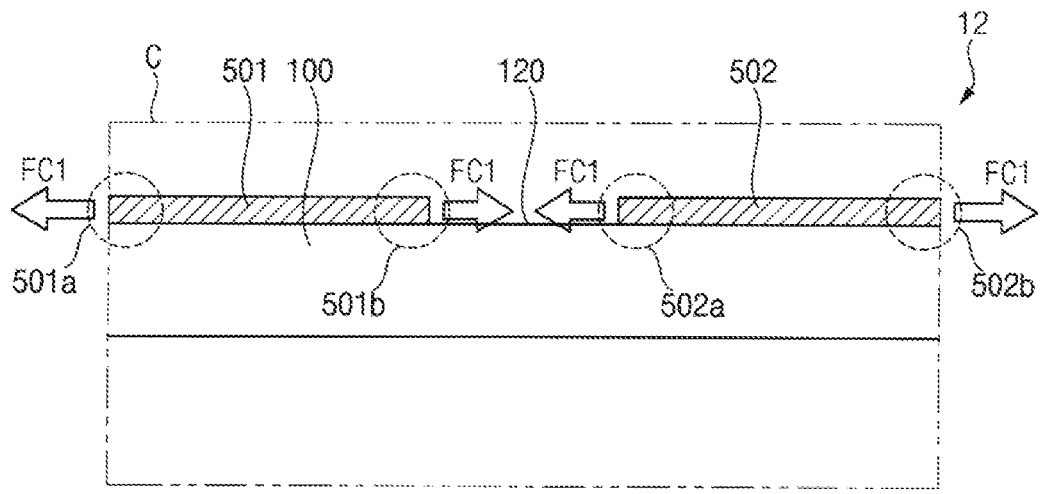
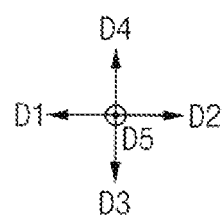
FIG. 18
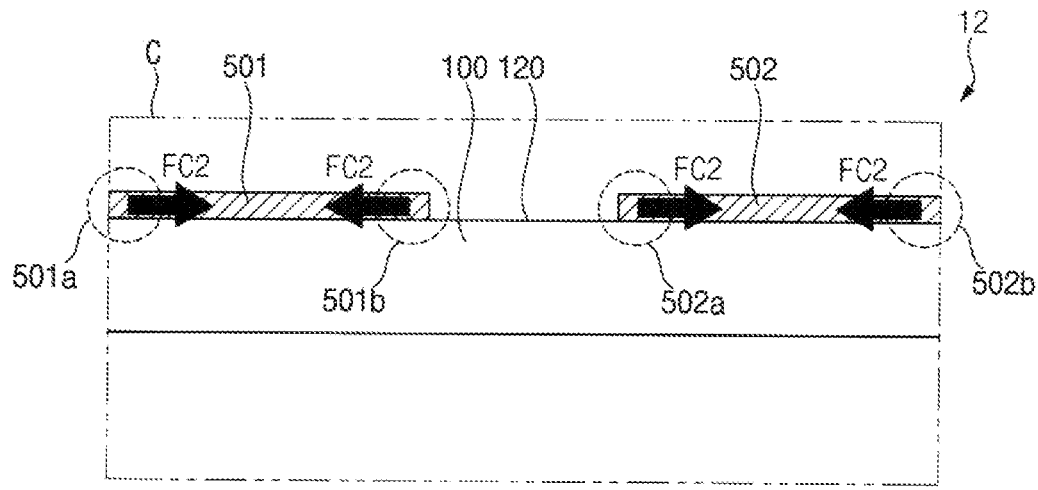
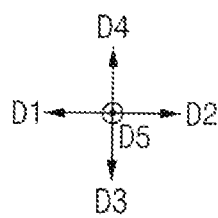

FIG. 23
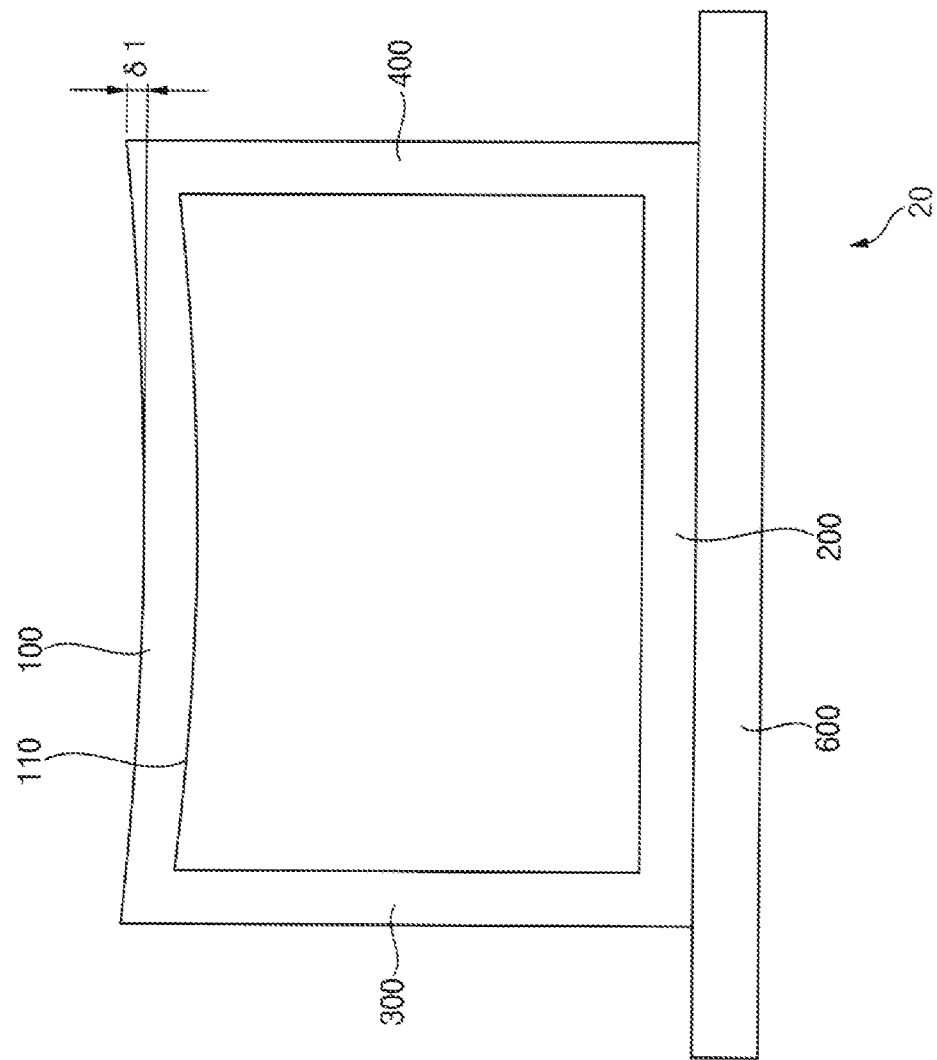
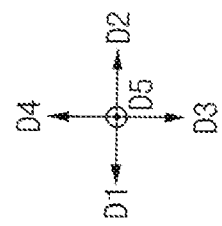

MASK FRAME AND METHOD OF MANUFACTURING THE SAME

CROSS-REFERENCE TO RELATED APPLICATIONS

This application claims priority from and the benefit of Korean Patent Application No. 10-2020-0180082, filed on Dec. 21, 2020, which is hereby incorporated by reference for all purposes as if fully set forth herein.

BACKGROUND

Field

Embodiments of the invention relate generally to a mask frame and a method of manufacturing the mask frame.

Discussion of the Background

A display device may include a plurality of pixels. Each of the plurality of pixels may include a light emitting layer disposed between opposite electrodes. The light emitting layer may be formed through various methods, one of which may be a deposition method using a mask. If a shape of a mask is deformed due to deformation of a mask frame supporting the mask in the process of forming the light emitting layer using the mask, the deposition reliability of the light emitting layer may be lowered.

The above information disclosed in this Background section is only for understanding of the background of the inventive concepts, and, therefore, it may contain information that does not constitute prior art.

SUMMARY

Devices constructed and methods according to illustrative implementations of the invention are capable of improving the formation of a light emitting layer on a display device using a mask frame having a tensile bar.

An object of the present invention is to provide a mask frame that may improve bending deformation of a frame.

Another object of the present invention is to provide a method of manufacturing a mask frame that may improve bending deformation of a frame.

Additional features of the inventive concepts will be set forth in the description which follows, and in part will be apparent from the description, or may be learned by practice of the inventive concepts.

A mask frame according to an embodiment may include a first horizontal portion, a second horizontal portion disposed under the first horizontal portion, at least one vertical portion connecting the first horizontal portion and the second horizontal portion and a tensile bar coupled to the first horizontal portion, and the tensile bar is configured to apply a contraction force to the first horizontal portion in a longitudinal direction of the tensile bar.

The tensile bar may be coupled to a lower surface of the first horizontal portion.

A first end region of the tensile bar and a second end region of the tensile bar opposite to the first end region may be welded to the first horizontal portion.

The tensile bar may include a first region and a second region applying a contraction force having a strength different from a strength of a contraction force applied from the first region.

The tensile bar may include metal.

The tensile bar may have a thickness in a range of about 50 µm to about 2 mm.

The tensile bar may include a first tensile bar and a second tensile bar.

The first tensile bar and the second tensile bar may be arranged in a longitudinal direction of the first horizontal portion.

The first tensile bar and the second tensile bar may be coupled to an upper surface of the first horizontal portion.

A mask frame according to an embodiment may include a first horizontal portion, a second horizontal portion disposed under the first horizontal portion, at least one vertical portion connecting the first horizontal portion and the second horizontal portion, a stage disposed under the second horizontal portion, and a tensile bar coupled to the vertical portion and the stage and which is configured to apply a contraction force to the vertical portion.

A first end region of the tensile bar may be rigidly attached, such as being welded, to the first vertical portion and a second end region of the tensile bar opposite to the first end region is rigidly attached, such as being welded, to the stage.

The tensile bar may include metal.

A method of manufacturing a mask frame according to an embodiment may include preparing a frame unit including a first horizontal portion, a second horizontal portion spaced apart from the first horizontal portion, and at least one vertical portion connecting the first horizontal portion and the second horizontal portion, applying a tensile force to a tensile bar in a longitudinal direction of the tensile bar and coupling the tensile bar to the first horizontal portion of the frame unit in a state in which the tensile force is applied to the tensile bar.

A first end region of the tensile bar and a second end region of the tensile bar opposite to the first end region may be welded to the first horizontal portion.

The method may further include measuring an amount of bending deformation of the first horizontal portion before applying the tensile force to the tensile bar in the longitudinal direction of the tensile bar, and a strength of the tensile force may be determined according to the amount of bending deformation.

The applying of the tensile force to the tensile bar in the longitudinal direction of the tensile bar may include applying mutually different tensile forces to a first region and a second region of the tensile bar, respectively, to compensate for the amount of bending deformation.

The tensile bar may include metal.

The tensile bar may have a thickness in a range of about 50 µm to about 2 mm.

The tensile bar may include a first tensile bar and a second tensile bar.

The first tensile bar and the second tensile bar may be arranged in a longitudinal direction of the first horizontal portion.

Since a tensile bar is coupled to a mask frame according to embodiments of the invention, sagging or bending deformation of a first horizontal portion, a first vertical portion, and a second vertical portion of a mask frame may be prevented. After the tensile force disappears from the tensile bar, a contraction force may be generated in the tensile bar, and deformation of the mask frame may be prevented due to the contraction force. Therefore, the deposition quality may be improved during the deposition process in which the mask frame is used.

In a method of manufacturing a mask frame according to embodiments of the invention, a tensile bar is stretched and welded to the mask frame, so that sagging or bending deformation of the first horizontal portion, the first vertical portion, and the second vertical portion of the mask frame may be prevented. That is, after the tensile force is removed from the tensile bar, a contraction force may be generated in the tensile bar, and deformation of the mask frame may be prevented due to the contraction force.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIGS. 17, 18, and 19 are enlarged views showing a mask frame according to an embodiment.

FIGS. 23 and 24 are plan views showing a method of manufacturing a mask frame according to an embodiment.

DESCRIPTION OF THE EMBODIMENTS

Figure 1:
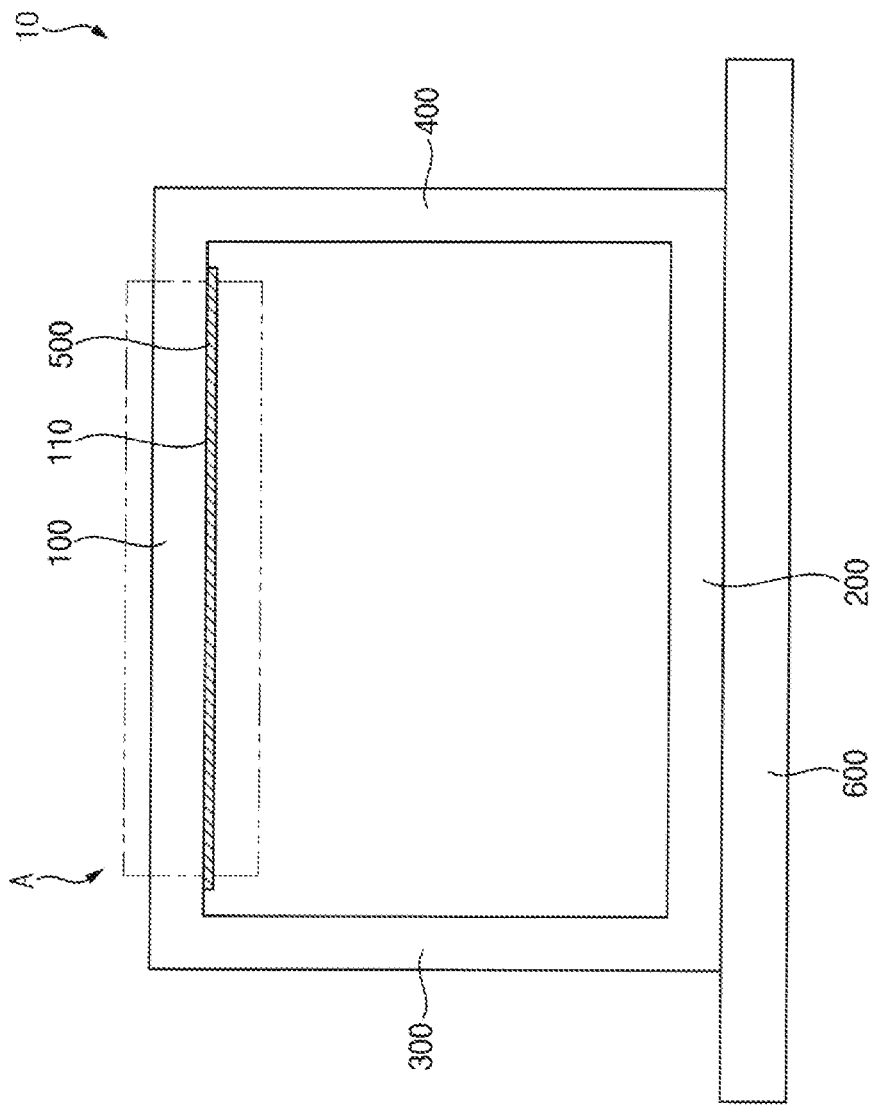
FIG. 1 is a plan view showing a mask frame according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
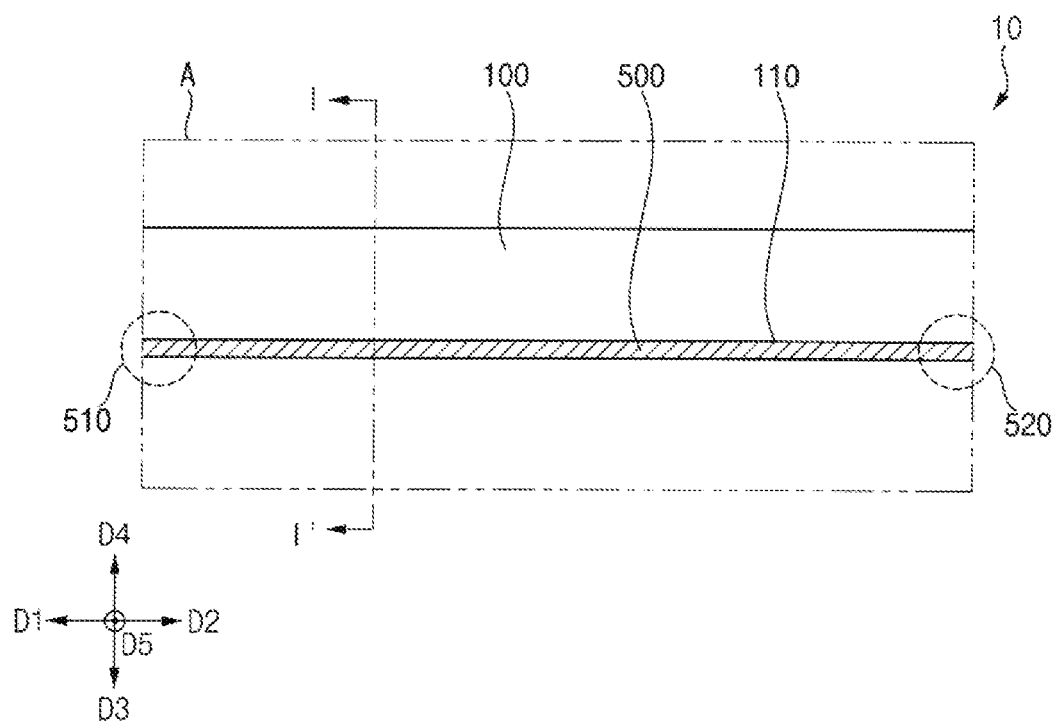
FIG. 2 is an enlarged view of an area A shown in FIG. 1.
Figure 3:
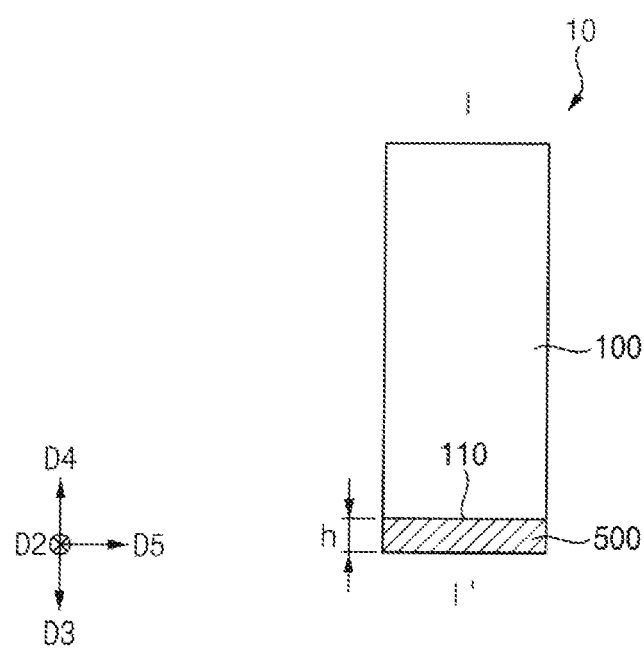
FIG. 3 is a sectional view taken along line I-I' shown in FIG. 2.

FIG. 1 is a plan view showing a mask frame according to an embodiment that is constructed according to principles of the invention, FIG. 2 is an enlarged view of an area A shown in FIG. 1, and FIG. 3 is a sectional view taken along line I-I' shown in FIG. 2.

Referring to FIGS. 1 to 3, a mask frame 10 may include a first horizontal portion 100, a second horizontal portion 200, a first vertical portion 300, a second vertical portion 400, a tensile bar 500, and a stage 600.

The second horizontal portion 200 may be disposed to be spaced apart from the first horizontal portion 100 and may be disposed under the first horizontal portion 100. The first vertical portion 300 may connect the first horizontal portion 100 and the second horizontal portion 200. The second vertical portion 400 may be spaced apart from the first vertical portion 300 and may connect the first horizontal portion 100 and the second horizontal portion 200. A lower surface 110 of the first horizontal portion 100 may be parallel to an upper surface of the stage 600.

The first horizontal portion 100, the second horizontal portion 200, the first vertical portion 300, and the second vertical portion 400 may constitute an outer frame. The mask frame 10 including the first horizontal portion 100, the second horizontal portion 200, the first vertical portion 300, and the second vertical portion 400 may have a rectangular shape in which an opening is formed.

The stage 600 may be disposed under the second horizontal portion 200. The first horizontal portion 100, the second horizontal portion 200, the first vertical portion 300, and the second vertical portion 400 may be disposed on the stage 600. When performing the deposition process using the mask frame 10, the stage 600 may be movable. The stage 600 may include a driver for moving the mask frame 10.

The tensile bar 500 may be disposed on the first horizontal portion 100. The tensile bar 500 may be coupled to the lower surface 110 of the first horizontal portion 100.

The tensile bar 500 may include a first end region 510 and a second end region 520 rigidly attached (i.e., welded, glued or attached by a mechanical connection unit (e.g., a loop)) to the lower surface 110 of the first horizontal portion 100. That is, the first end region 510 and the second end region 520 may refer to portions of the tensile bar 500 rigidly attached (i.e., welded, glued or attached by the mechanical connection unit (e.g., a loop)) to the lower surface 110 of the first horizontal portion 100. The first end region 510 may be defined as a portion adjacent to the first short side of the tensile bar 500. The second end region 520 may be defined as a portion adjacent to the second short side and opposite to the first end region 510. The first end region 510 and the second end region 520 of the tensile bar 500 may be fixed to the lower surface 110 of the first horizontal portion 100 by welding.

A mask assembly may include the mask frame 10 and a mask. When the tensile bar 500 is not attached, the mask assembly may be deformed. Specifically, the first horizontal portion 100 may be subject to a load due to gravity and weight of the mask so that the first horizontal portion 100 may be subject to bending deformation in a downward direction D3. In order to correct the bending deformation, the tensile bar 500 may be attached to the lower surface 110 of the first horizontal portion 100 in a stretched state. The tensile bar 500 may apply a contraction force to the first horizontal portion 100 in the longitudinal directions D1 and D2 of the tensile bar 500. The process for attaching the tensile bar 500 to the lower surface 110 of the first horizontal portion 100 may be performed to compensate for the bending deformation generated in the first horizontal portion 100 by inducing bending deformation in the opposite direction D4.

When the mask assembly is deformed, the deposition material may not be deposited on a predetermined position during the formation of a light emitting layer using the mask assembly. That is, the deposition quality may be lowered. Therefore, the tensile bar 500 may be coupled to the first horizontal portion 100 to improve the deposition quality by preventing the bending deformation of the first horizontal portion 100. The principle for correcting the bending deformation will be described in detail below.

Figure 4:
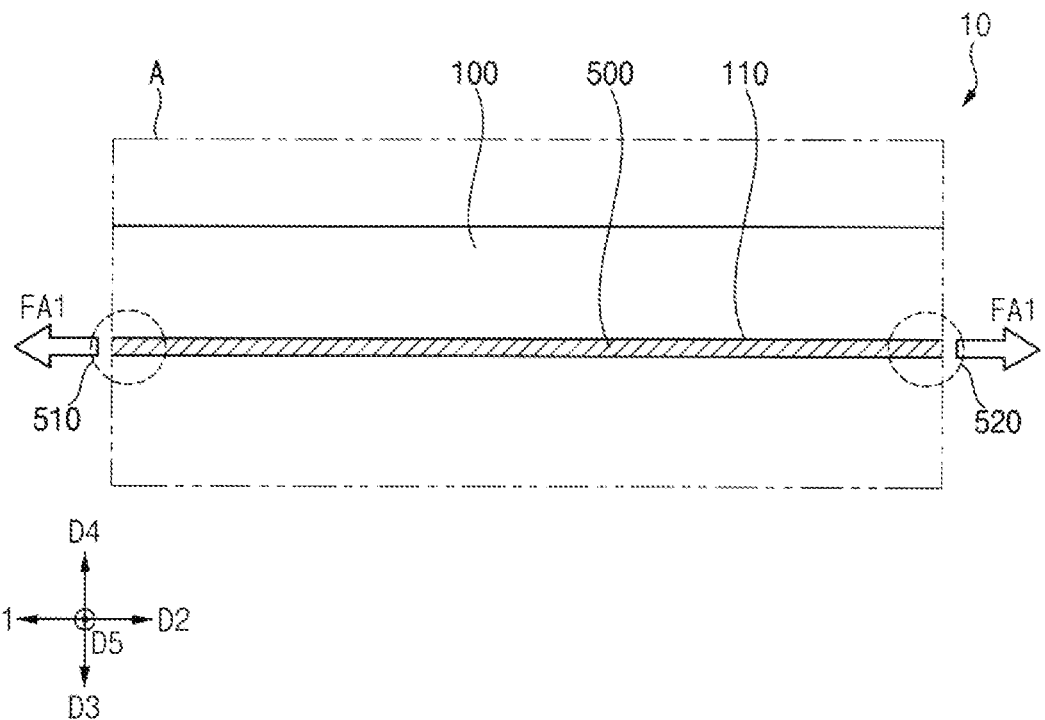
FIGS. 4, 5, and 6 are enlarged views showing a mask frame according to an embodiment.
Figure 5:
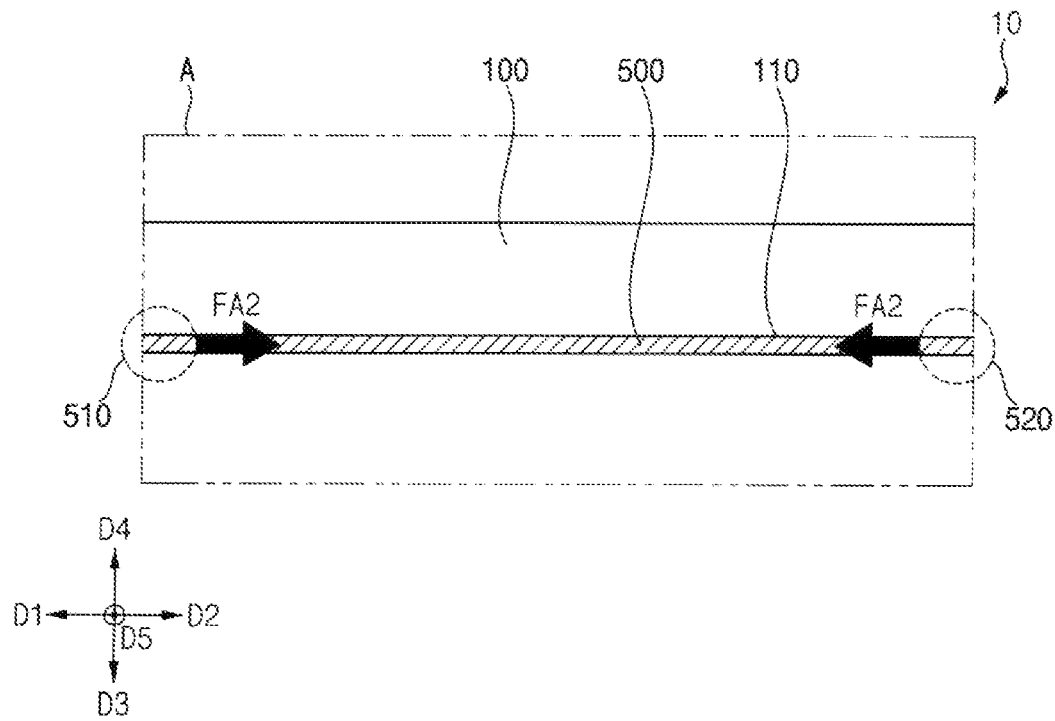
Figure 6:
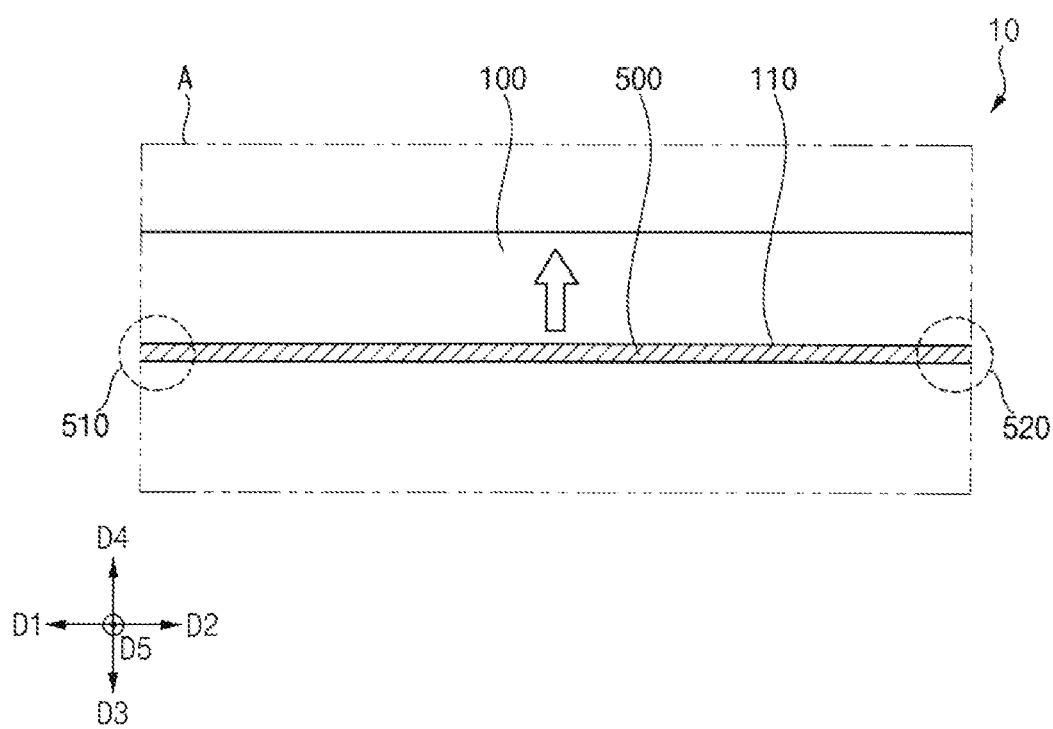

FIGS. 4 to 6 are enlarged views showing a mask frame according to an embodiment.

Referring to FIG. 4, the tensile bar 500 may be stretchable. Specifically, the tensile bar 500 may be subject to the tensile force FA1 in the longitudinal directions D1 and D2 of the tensile bar 500. The tensile bar 500 may be rigidly attached (i.e., welded, glued or attached by the mechanical connection unit (e.g., a loop)) to a lower surface 110 of the first horizontal portion 100 in a stretched state by receiving the tensile force FA1.

In the tensile bar 500, a first end region 510 and a second end region 520 of the tensile bar 500 may be subject to the tensile force FA1. In order to compensate for the bending deformation, the first end region 510 and the second end region 520 may be subject to the same tensile force FA1 in the longitudinal directions D1 and D2 of the tensile bar 500, respectively. In detail, the first end region 510 may be subject to the tensile force FA1 in the direction D1. The second end region 520 may be subject to the tensile force FA1 the same as that of the first end region 510 in the direction D2 that is opposite to the direction D1. The first end region 510 and the second end region 520 may be rigidly attached (i.e., welded, glued or attached by the mechanical connection unit (e.g., a loop)) to the lower surface 110 of the first horizontal portion 100 in a stretched state by receiving the tensile force FA1.

Referring to FIG. 5, the tensile bar 500 may be attached to the first horizontal portion 100 and the tensile force FA1 applied to the first end region 510 and the second end region 520 may disappear. When the tensile force FA1 disappears (e.g., is no longer applied to the tensile bar 500), the tensile bar 500 may be contracted to return to the original state thereof. A contraction force FA2 may be generated in the tensile bar 500. The direction of the contraction force FA2 may be opposite to the direction of the tensile force FA1. The contraction force FA2 may be generated in the direction D2 at the first end region 510, and the contraction force FA2 may be generated in the direction D1 at the second end region 520.

When the contraction force FA2 is generated in the tensile bar 500, the contraction force FA2 may be applied to the first horizontal portion 100 coupled to the tensile bar 500. The first end region 510 and the second end region 520 rigidly attached (i.e., welded, glued or attached by the mechanical connection unit (e.g., a loop)) to the first horizontal portion 100 may apply the contraction force FA2 to the lower surface 110 of the first horizontal portion 100. The first end region 510 may apply the contraction force FA2 in the direction D2 to the lower surface 110 of the first horizontal portion 100 adjacent to the first end region 510. The second end region 520 may apply the contraction force FA2 in the direction D1 to the lower surface 110 of the first horizontal portion 100 adjacent to the second end region 520.

Referring to FIG. 6, when the lower surface 110 of the first horizontal portion 100 is subject to the contraction force FA2, the central portion of the first horizontal portion 100 may be deformed in the upward direction D4 by the contraction force FA2. That is, the bending deformation may occur in the first horizontal portion 100 in the upward direction D4. Accordingly, the bending deformation in the downward direction D3 of the first horizontal portion 100 and the bending deformation in the upward direction D4 of the first horizontal portion 100 may be canceled. In more detail, the first horizontal portion 100 to which the tensile bar 500 is not coupled may be subject to the bending deformation in the downward direction D3 due to the gravity. However, since the tensile bar 500 is coupled to the first horizontal portion 100, the bending deformation may occur in the upward direction D4 of the first horizontal portion 100. As a result, the bending deformation of the first horizontal portion 100 may be canceled as a result of having a tensile bar 500 provided on a bottom surface of the first horizontal portion 100.

The tensile bar 500 may include a material having high yield strength. The yield strength may refer to the degree of maximum stress that may be applied to a material without causing plastic deformation. When the plastic deformation occurs in the tensile bar 500, the tensile bar 500 may not be restored to the original state thereof even if the tensile force FA1 applied to the tensile bar 500 is no longer applied (i.e., disappears). That is, the tensile bar 500 may be permanently deformed. Therefore, in order to prevent the plastic deformation from occurring in the tensile bar 500, the tensile bar 500 may include a material having high yield strength. For example, a material having high yield strength may refer to a metal. When a tensile force FA1 less than the yield strength of the metal is applied to the tensile bar 500, the plastic deformation may not occur in the tensile bar 500. That is, when the tensile force FA1 disappears, the tensile bar 500 may be restored to the original state thereof, and the contraction force FA2 may be generated in the tensile bar 500.

A device for applying the tensile force FA1 to the tensile bar 500 may exist. For example, a stretching device may apply the tensile force FA1 to the tensile bar 500 by stretching the tensile bar 500. The stretching device may be formed as a clamp to fix the first end region 510, and the second end region 520. The stretching device may change position to stretch the tensile bar 500. Also, the stretching device may include a cylinder or a gear and a motor to stretch the tensile bar 500. The stretching device may include a load cell that detects how much force the clamp moves the tensile bar 500.

Referring again to FIG. 3, the tensile bar 500 may have a thickness h in the range of about 50 µm to about 2 mm. When the thickness h of the tensile bar 500 exceeds about 2 mm, it is not easy to adjust the tensile force FA1 when the tensile force FA1 for canceling the bending deformation of the first horizontal portion 100 is applied to the tensile bar 500. In addition, when the thickness h of the tensile bar 500 exceeds about 2 mm, the tensile bar 500 may interfere with deposition materials deposited on a light emitting layer during the deposition process that is performed by using a mask assembly. As a result, the deposition quality may be deteriorated.

When the thickness h of the tensile bar 500 is less than 50 µm, the contraction force FA2 generated in the tensile bar 500 may be relatively small. That is, when the contraction force FA2 for restoring the tensile bar 500 to the original state is generated, the contraction force FA2 may not be sufficiently applied to the first horizontal portion 100. In addition, the bending deformation of the first horizontal portion 100 may not be canceled because the bending deformation of the first horizontal portion 100 in the upward direction D4 due to the contraction force FA2 is smaller than the bending deformation of the first horizontal portion 100 in the downward direction D3.

In the case of the first horizontal portion 100 coupled with the tensile bar 500, the bending deformation of the first horizontal portion 100 in the downward direction D3 may be improved as compared with the first horizontal portion 100 to which the tensile bar 500 is not coupled. Accordingly, the deposition quality may be improved during the deposition process for forming the light emitting layer using the mask frame 10.

Figure 7:
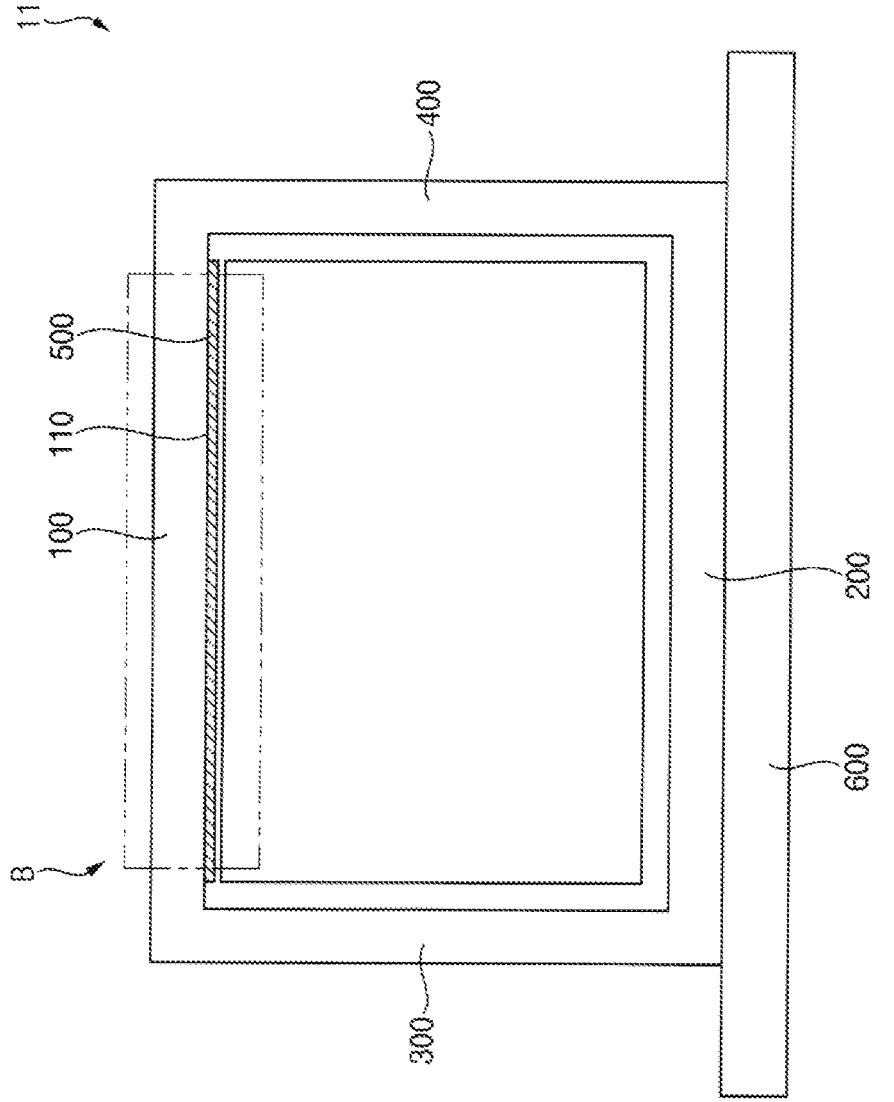
FIG. 7 is a plan view showing a mask frame according to an embodiment.
Figure 8:
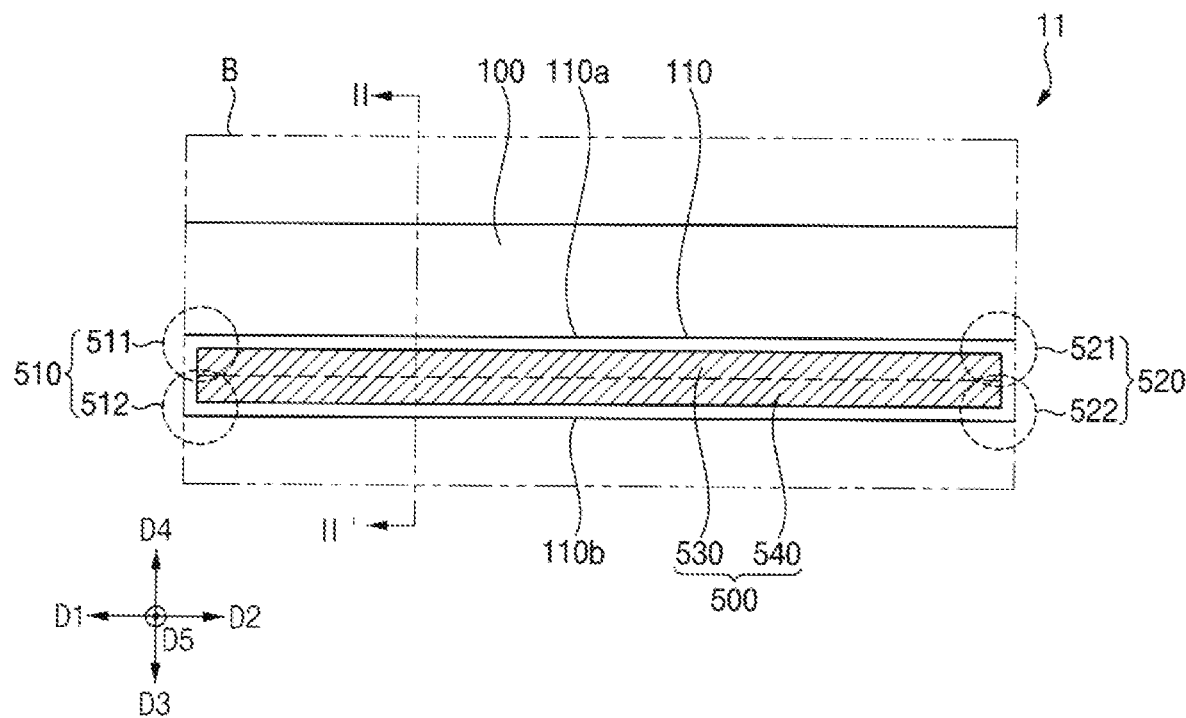
FIG. 8 is an enlarged view of an area B shown in FIG. 7.
Figure 9:
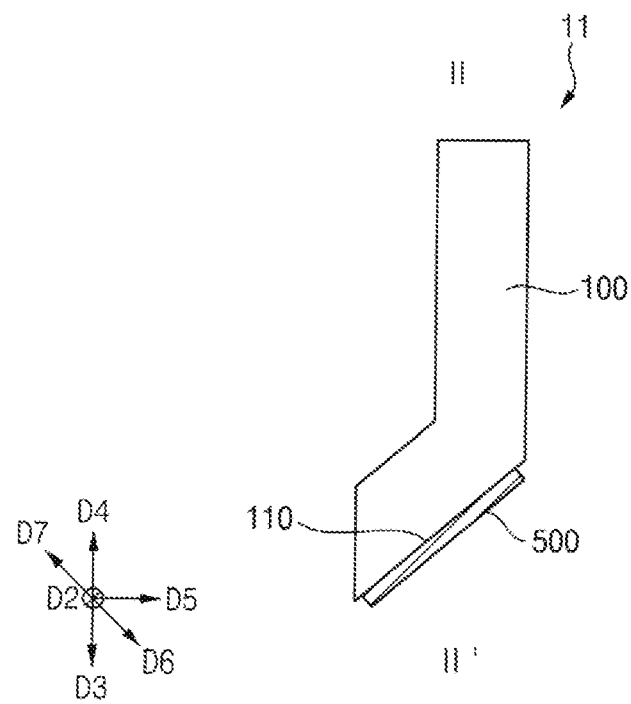
FIG. 9 is a sectional view taken along line II-II' shown in FIG. 8.

FIG. 7 is a plan view showing a mask frame according to an embodiment, FIG. 8 is an enlarged view of an area B shown in FIG. 7, and FIG. 9 is a sectional view taken along line shown in FIG. 8.

Referring to FIGS. 7 to 9, a mask frame 11 according to an embodiment may include a first horizontal portion 100, a second horizontal portion 200, a first vertical portion 300, a second vertical portion 400, a tensile bar 500, and a stage 600. A lower surface 110 of the first horizontal portion 100 may be inclined with respect to an upper surface of the stage 600.

The tensile bar 500 may be disposed on the first horizontal portion 100. The tensile bar 500 may be coupled to the lower surface 110 of the first horizontal portion 100.

The tensile bar 500 may include a first region 530 and a second region 540. The first region 530 may be a portion adjacent to a first long side 110a of the lower surface 110. The second region 540 may be a portion adjacent to a second long side 110b of the lower surface 110. In one embodiment, the tensile bar 500 may include only the first region 530 and the second region 540. However, embodiments of the invention are not limited thereto, and for example, the tensile bar 500 may include three or more regions.

A first end region 510 of the tensile bar 500 and a second end region 520 of the tensile bar 500 opposite to the first end region 510 may be welded to the first horizontal portion 100, to thereby provide for a rigid attachment of the tensile bar 500 to the first horizontal portion 100. Alternative ways to provide a rigid attachment include using a resin glue substance, for example. The first end region 510 and the second end region 520 may refer to portions of the tensile bar 500 rigidly attached (i.e., welded) to the lower surface 110 of the first horizontal portion 100. The first end region 510 may include an upper portion 511 of the first end region 510 positioned in the first region 530 and a lower portion 512 of the first end region 510 positioned in the second region 540. The second end region 520 may include an upper portion 521 of the second end region 520 positioned in the first region 530 and a lower portion 522 of the second end region 520 positioned in the second region 540.

Unlike the mask frame 10 shown in FIGS. 1 to 3, in the mask frame 11 shown in FIGS. 7 to 9, the lower surface 110 of the first horizontal portion 100 may be inclined with respect to an upper surface of the stage 600. Similar to the mask frame 10 shown in FIGS. 1 to 3, the first horizontal portion 100 of the mask frame 11 shown in FIGS. 7 to 9 may be bent due to the gravity and the weight of the mask. However, the first horizontal portion 100 may be bent in the direction D6. The direction D6 may exist on the same plane with the direction D5 and the direction D3, and angles between the direction D5 and the direction D6 and between the direction D6 and the direction D3 may be acute angles.

Figure 11:
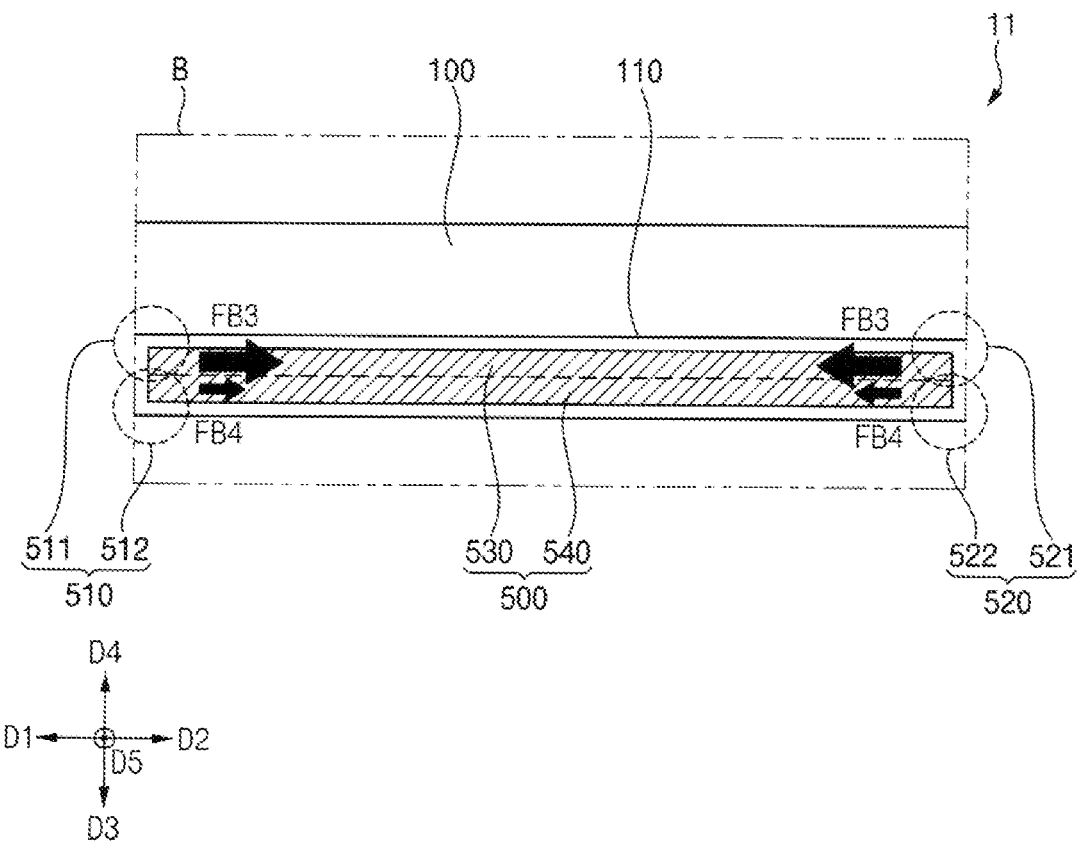

Referring to FIGS. 9 and 11, when the lower surface 110 of the first horizontal portion 100 is inclined, the gravity may be applied to the lower surface 110 of the first horizontal portion 100 in the directions D3 and D5. Accordingly, the first horizontal portion 100 may be bent in the direction D6, that is, the bending deformation may occur. In order to compensate for the bending deformation, the first region 530 and the second region 540 of the tensile bar 500 may apply mutually different contraction forces FB2 to the lower surface 110 of the first horizontal portion 100, respectively. In other words, in order to compensate for the bending deformation, the contraction force FB2 applied to the first horizontal portion 100 by the first region 530 of the tensile bar 500 may be greater than the contraction force FB2 applied to the first horizontal portion 100 by the second region 540 of the tensile bar 500.

The process of attaching the tensile bar 500 to the lower surface 110 of the first horizontal portion 100 may be performed to cancel the bending deformation generated in the first horizontal portion 100 by inducing the bending deformation in the direction D7 opposite to the direction D6.

Figure 10:
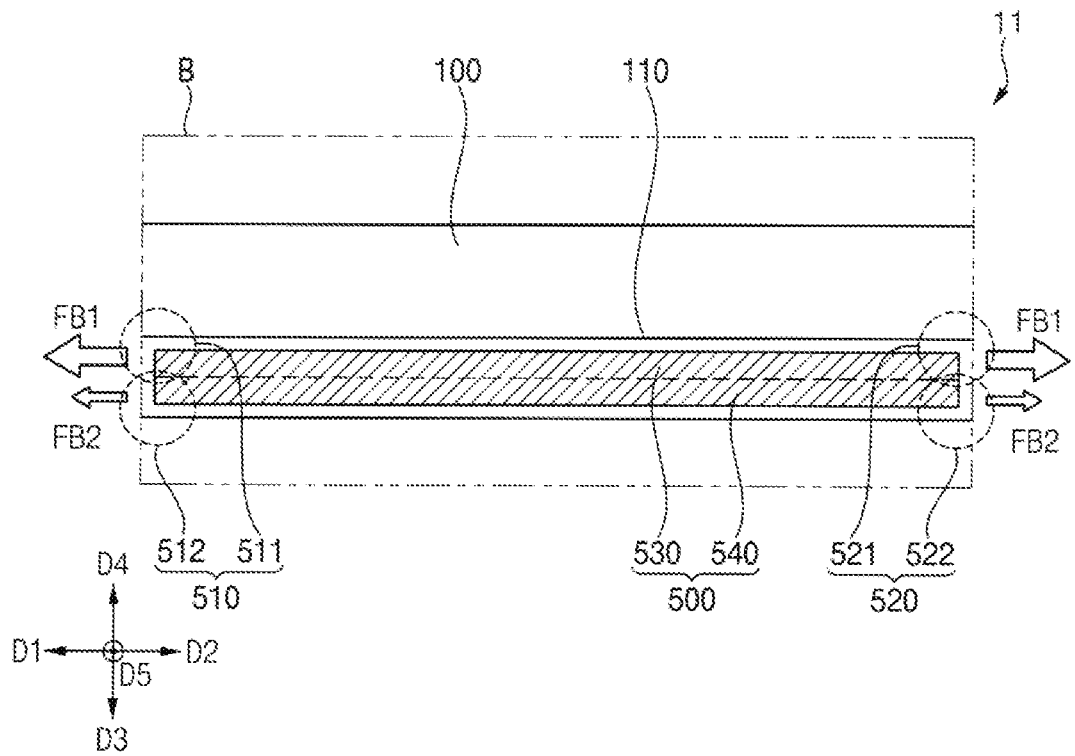
FIGS. 10, 11, and 12 are enlarged views showing a mask frame according to an embodiment.
Figure 12:
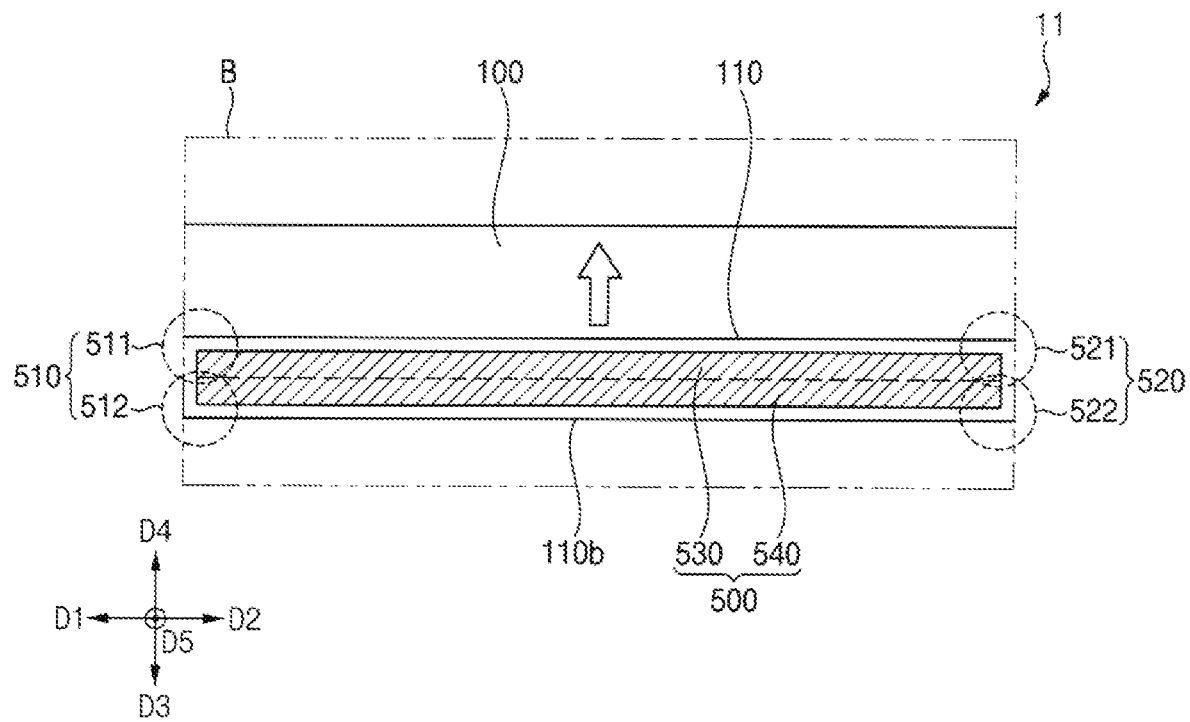
Figure 13:
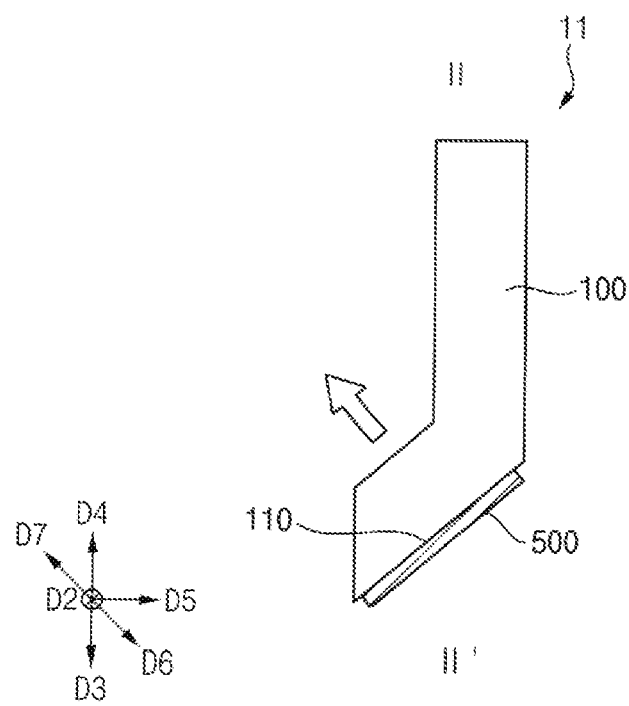
FIG. 13 is a sectional view showing a mask frame according to an embodiment.

FIGS. 10 to 12 are enlarged views showing a mask frame according to an embodiment. FIG. 13 is a sectional view showing a mask frame according to an embodiment.

Referring to FIG. 10, the tensile bar 500 may be stretchable. Specifically, the tensile bar 500 may be subject to tensile forces FB1 and FB2 in the longitudinal directions D1 and D2 of the tensile bar 500. The tensile bar 500 may be rigidly attached (i.e., welded, glued or attached by the mechanical connection unit (e.g., a loop)) to the lower surface 110 of the first horizontal portion 100 in a stretched state by receiving the tensile forces FB1 and FB2.

The first region 530 and the second region 540 of the tensile bar 500 may be subject to mutually different tensile forces. That is, the tensile force FB1 applied to the first region 530 may be greater than the tensile force FB2 applied to the second region 540.

In the tensile bar 500, the first end region 510 and the second end region 520 of the tensile bar 500 may be subject to the tensile forces FB1 and FB2, respectively. In order to cancel the bending deformation, the upper portion 511 of the first end region 510 and the upper portion 521 of the second end region 520 may be subject to the same tensile force FB1 in the longitudinal directions D1 and D2 of the tensile bar 500, respectively. The lower portion 512 of the first end region 510 and the lower portion 522 of the second end region 520 may be subject to the same tensile force FB2 in the longitudinal directions D1 and D2 of the tensile bar 500, respectively.

In more detail, the upper portion 511 of the first end region 510 may be subject to the tensile force FB1 in the direction D1. The upper portion 521 of the second end region 520 may be subject to the tensile force FB1, which is the same as the tensile force applied to the upper portion 511 of the first end region 510, in the direction D2. Likewise, the lower portion 512 of the first end region 510 may be subject to the tensile force FB2 in the direction D1. The lower portion 522 of the second end region 520 may be subject to the tensile force FB2, which is the same as the tensile force applied to the lower portion 512 of the first end region 510, in the direction D2.

Referring to FIG. 11, after the tensile bar 500 has been attached to the first horizontal portion 100, the tensile force FB1 applied to the upper portion 511 of the first end region 510 and the upper portion 521 of the second end region 520 and the tensile force FB2 applied to the lower portion 512 of the first end region 510 and the lower portion 522 of the second end region 520 may disappear. When the tensile forces FB1 and FB2 disappear, the tensile bar 500 may contract to return to the original state thereof. Contraction forces FB3 and FB4 may be generated in the tensile bar 500. Similar to the tensile force, the first region 530 and the second region 540 of the tensile bar 500 may be subject to mutually different contraction forces. That is, the contraction force FB1 applied to the first region 530 may be greater than the contraction force FB2 applied to the second region 540.

The directions of the contraction forces FB3 and FB4 may be opposite to the directions of the tensile forces FB1 and FB2. The upper portion 511 of the first end region 510 may be subject to the contraction force FB3 in the direction D2, and the upper portion 521 of the second end region 520 may be subject to the contraction force FB3 in the direction D1. Similarly, the lower portion 512 of the first end region 510 may be subject to the contraction force FB4 in the direction D2, and the lower portion 522 of the second end region 520 may be subject to the contraction force FB4 in the direction D1.

When the contraction forces FB3 and FB4 are generated in the tensile bar 500, the contraction forces FB3 and FB4 may be applied to the first horizontal portion 100 coupled to the tensile bar 500. The first end region 510 and the second end region 520 rigidly attached (i.e., welded, glued or attached by the mechanical connection unit (e.g., a loop)) to the first horizontal portion 100 may apply the contraction forces FB3 and FB4 to the lower surface 110 of the first horizontal portion 100. The upper portion 511 of the first end region 510 and the upper portion 521 of the second end region 520, which are positioned in the first region 530, and the lower portion 512 of the first end region 510 and the lower portion 522 of the second end region 520, which are positioned in the second region 540, may apply mutually different contraction forces to the lower surface 110 of the first horizontal portion 100.

Specifically, the upper portion 511 of the first end region 510 may apply the contraction force FB3 in the direction D2 to the lower surface 110 of the first horizontal portion 100 adjacent to the first end region 510. The upper portion 521 of the second end region 520 may apply the contraction force FB3 in the direction D1 to the lower surface 110 of the first horizontal portion 100 adjacent to the second end region 520. The lower portion 512 of the first end region 510 may apply the contraction force FB4 in the direction D2 to the lower surface 110 of the first horizontal portion 100 adjacent to the first end region 510. The lower portion 522 of the second end region 520 may apply the contraction force FB4 in the direction D1 to the lower surface 110 of the first horizontal portion 100 adjacent to the second end region 520.

Referring to FIGS. 12 and 13, when the lower surface 110 of the first horizontal portion 100 is subject to the contraction forces FB3 and FB4, the central portion of the first horizontal portion 100 may be deformed in the direction D7 by the contraction forces FB3 and FB4. That is, the bending deformation in the direction D7 may occur in the first horizontal portion 100. Accordingly, the bending deformation in the direction D6 and the bending deformation in the direction D7 of the first horizontal portion 100 may be canceled. In detail, the first horizontal portion 100 to which the tensile bar 500 is not coupled may be subject to the bending deformation in the direction D6 due to the gravity. However, since the tensile bar 500 is coupled to the first horizontal portion 100, the bending deformation may occur in the direction D7 of the first horizontal portion 100. As a result, the bending deformation of the first horizontal portion 100 may be canceled.

Figure 14:
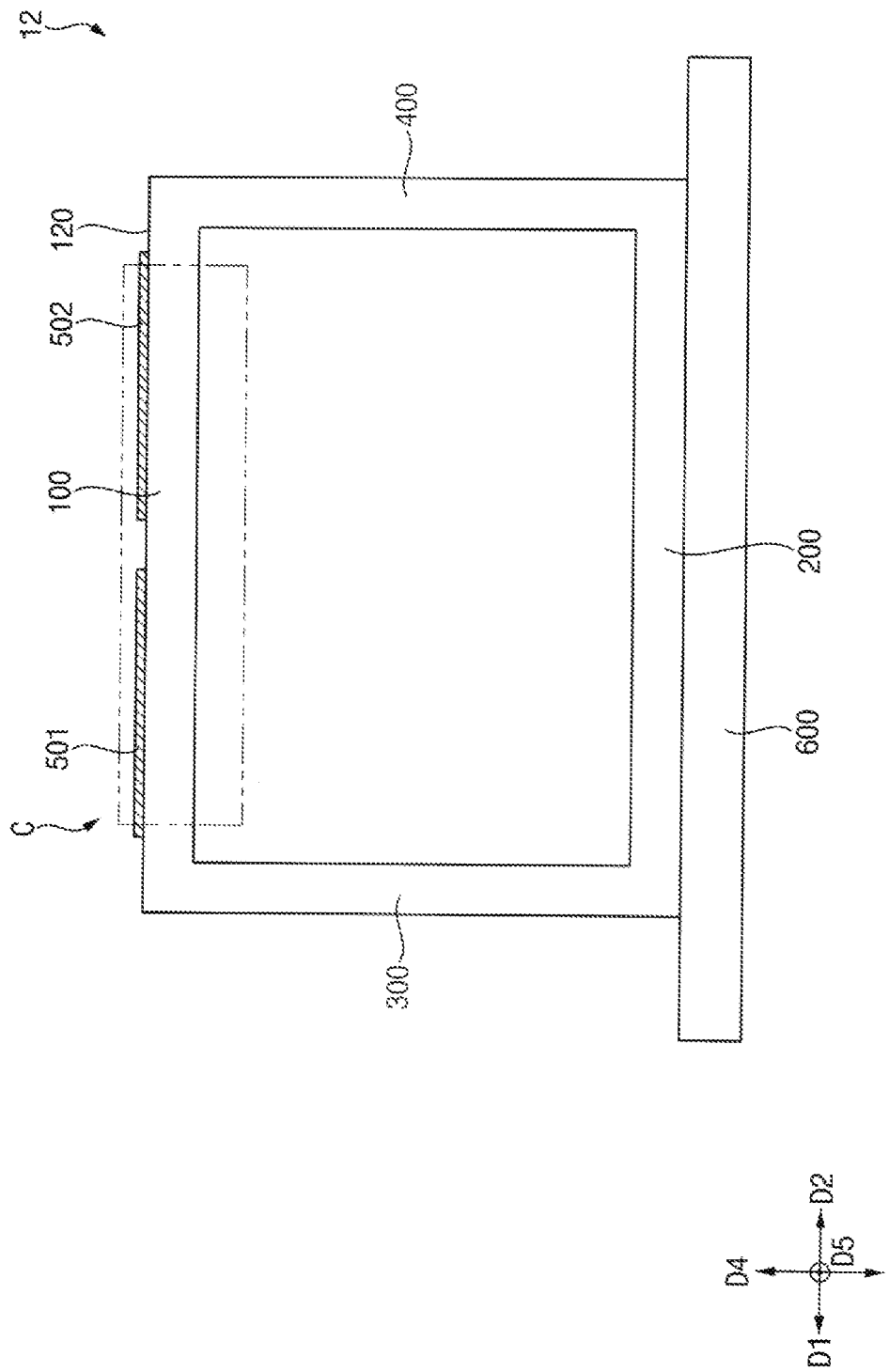
FIG. 14 is a plan view showing a mask frame according to an embodiment.
Figure 15:
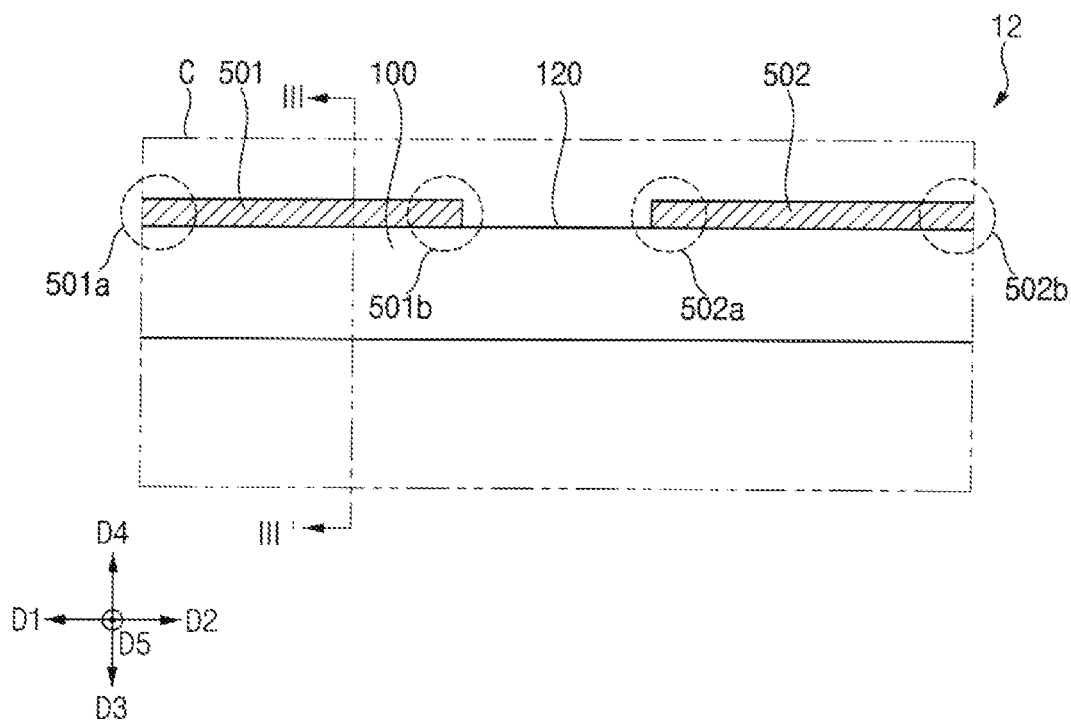
FIG. 15 is an enlarged view of an area C shown in FIG. 14.
Figure 16:
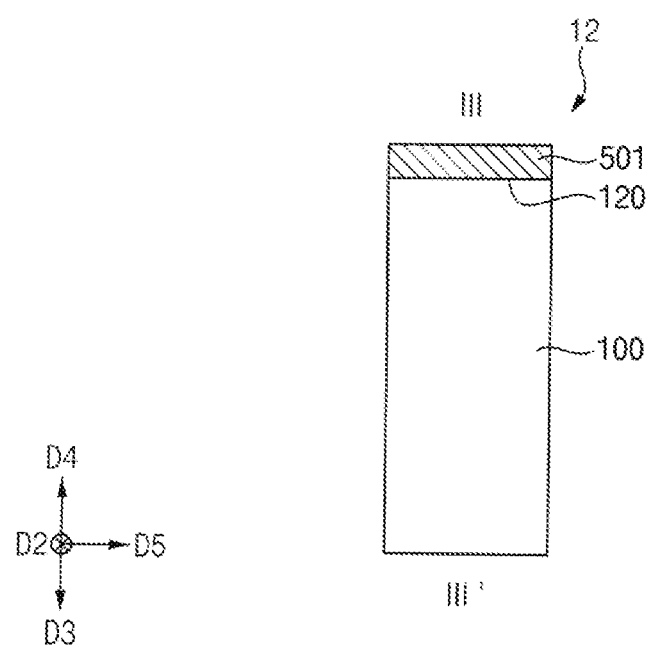
FIG. 16 is a sectional view taken along line shown in FIG. 15.

FIG. 14 is a plan view showing a mask frame according to an embodiment, FIG. 15 is an enlarged view of an area C shown in FIG. 14, and FIG. 16 is a sectional view taken along line III-III' shown in FIG. 15.

Referring to FIGS. 14 to 16, a mask frame 12 according to an embodiment may include a first horizontal portion 100, a second horizontal portion 200, a first vertical portion 300, a second vertical portion 400, a tensile bar 500, and a stage 600. A lower surface 110 of the first horizontal portion 100 may be parallel to an upper surface of the stage 600.

The tensile bar 500 may be disposed on the first horizontal portion 100. The tensile bar 500 may include a first tensile bar 501 and a second tensile bar 502. The first tensile bar 501 and the second tensile bar 502 may be arranged in the longitudinal directions D1 and D2 of the first horizontal portion 100. The first tensile bar 501 and the second tensile bar 502 may be coupled to an upper surface 120 of the first horizontal portion 100.

The first tensile bar 501 may include one end region 501a and the other end region 501b, which are rigidly attached (i.e., welded, glued or attached by the mechanical connection unit (e.g., a loop)) to the upper surface 120 of the first horizontal portion 100. That is, the one end region 501a and the other end region 501b may refer to portions of the first tensile bar 501 rigidly attached (i.e., welded, glued or attached by the mechanical connection unit (e.g., a loop)) to the lower surface 110 of the first horizontal portion 100. The one end region 501a may be defined as a portion adjacent to a first short side of the first tensile bar 501. The other end region 501b may be defined as a portion adjacent to a second short side and opposite to the one end region 501a. The one end region 501a and the other end region 501b of the first tensile bar 501 may be fixed to the upper surface 120 of the first horizontal portion 100 by welding.

The second tensile bar 502 may include one end region 502a and the other end region 502b, which are rigidly attached (i.e., welded, glued or attached by the mechanical connection unit (e.g., a loop)) to the upper surface 120 of the first horizontal portion 100. The description about the configurations the same as the first tensile bar 501 will be omitted for ease in explanation of the embodiment.

Figure 19:
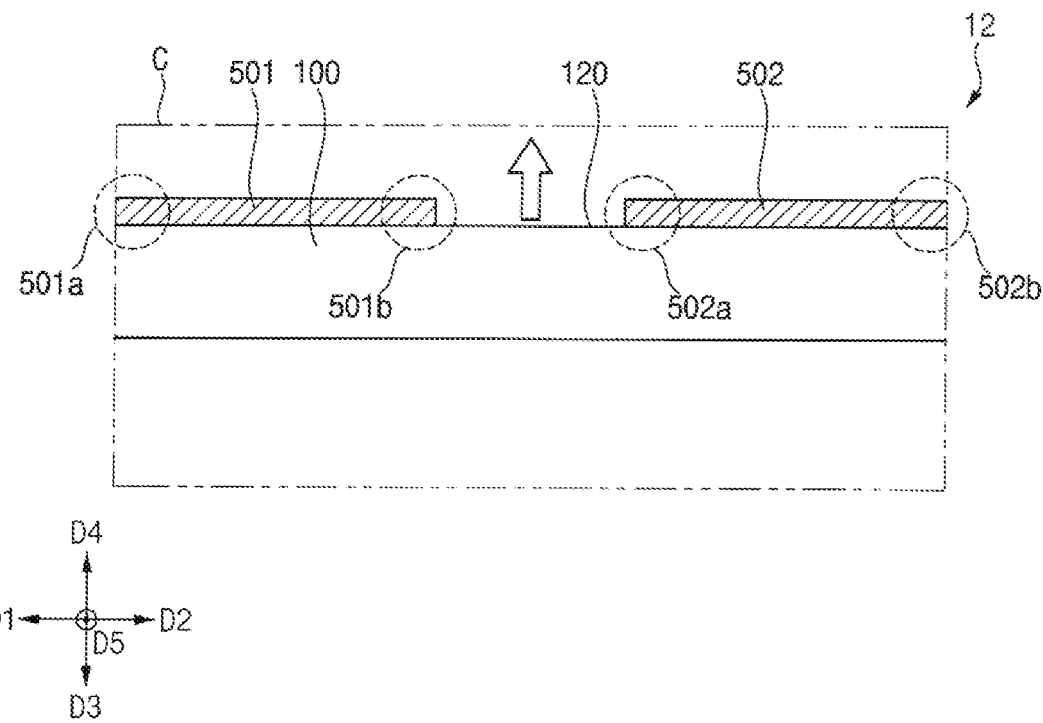

FIGS. 17 to 19 are enlarged views showing a mask frame according to an embodiment.

Referring to FIG. 17, the first tensile bar 501 and the second tensile bar 502 may be stretchable. Specifically, the first tensile bar 501 and the second tensile bar 502 may be subject to a tensile force FC1 in the longitudinal directions D1 and D2 of the first tensile bar 501 and the second tensile bar 502. The first tensile bar 501 and the second tensile bar 502 may be rigidly attached (i.e., welded, glued or attached by the mechanical connection unit (e.g., a loop)) to the upper surface 120 of the first horizontal portion 100 in a stretched state by receiving the tensile force FC1.

One end region 501a and the other end region 501b of the first tensile bar 501 may be subject to the tensile force FC1. Similarly, one end region 502a and the other end region 502b of the second tensile bar 502 may be subject to the tensile force FC1. In order to cancel the bending deformation, the one end regions 501a and 502a and the other end regions 501b and 502b of the first tensile bar 501 and the second tensile bar 502 may be subject to the same tensile force FC1 in the longitudinal direction D1 and D2 of the tensile bar 500. Specifically, the one end regions 501a and 502a may be subject to the tensile force FC1 in the direction D1. The other end regions 501b and 502b may be subject to the tensile force FC1, which is the same as the tensile force applied to the first end region 510, in the direction D2. The first end regions 501a and 502a and the other end regions 501b and 502b may be rigidly attached (i.e., welded, glued or attached by the mechanical connection unit (e.g., a loop)) to the upper surface 120 of the first horizontal portion 100 in a stretched state by receiving the tensile force FC1.

Referring to FIG. 18, the first tensile bar 501 and the second tensile bar 502 may be attached to the first horizontal portion 100, and the tensile force FC1 applied to the one end regions 501a and 502a and the other end regions 501b and 502b may disappear. When the tensile force FC1 disappears, the first tensile bar 501 and the second tensile bar 502 may contract to return to the original state thereof. The contraction force FC2 may be generated in the first tensile bar 501 and the second tensile bar 502. The direction of the contraction force FC2 may be opposite to the direction of the tensile force FC1. The one end regions 501a and 502a may be subject to the contraction force FC2 in the direction D2, and the other end regions 501b and 502b may be subject to the contraction force FC2 in the direction D1.

As the contraction force FC2 is generated in the first tensile bar 501 and the second tensile bar 502, the contraction force FC2 may be applied to the first horizontal portion 100 coupled to the first tensile bar 501 and the second tensile bar 502. The one end regions 501a and 502a and the other end regions 501b and 502b rigidly attached (i.e., welded, glued or attached by the mechanical connection unit (e.g., a loop)) to the first horizontal portion 100 may apply the contraction force FC2 to the upper surface 120 of the first horizontal portion 100. The one end regions 501a and 502a may apply the contraction force FC2 in the direction D2 to the upper surface 120 of the first horizontal portion 100 adjacent to the one end regions 501a and 502a. The other end regions 501b and 502b may apply the contraction force FC2 in the direction D1 to the upper surface 120 of the first horizontal portion 100 adjacent to the other end regions 501b and 502b.

Referring to FIG. 19, when the upper surface 120 of the first horizontal portion 100 is subject to the contraction force FC2, the first horizontal portion 100 may be deformed in the upward direction D4 by the contraction force FC2. That is, the bending deformation in the upward direction D4 may occur in the first horizontal portion 100. Accordingly, the bending deformation in the downward direction D3 and the bending deformation in the upward direction D4 of the first horizontal portion 100 may be canceled. In detail, the first horizontal portion 100 to which the tensile bar 500 is not coupled may be subject to the bending deformation in the downward direction D3 due to the gravity. However, since the tensile bar 500 is coupled to the first horizontal portion 100, the bending deformation may occur in the upward direction D4 of the first horizontal portion 100. As a result, the bending deformation of the first horizontal portion 100 may be canceled.

Figure 20:
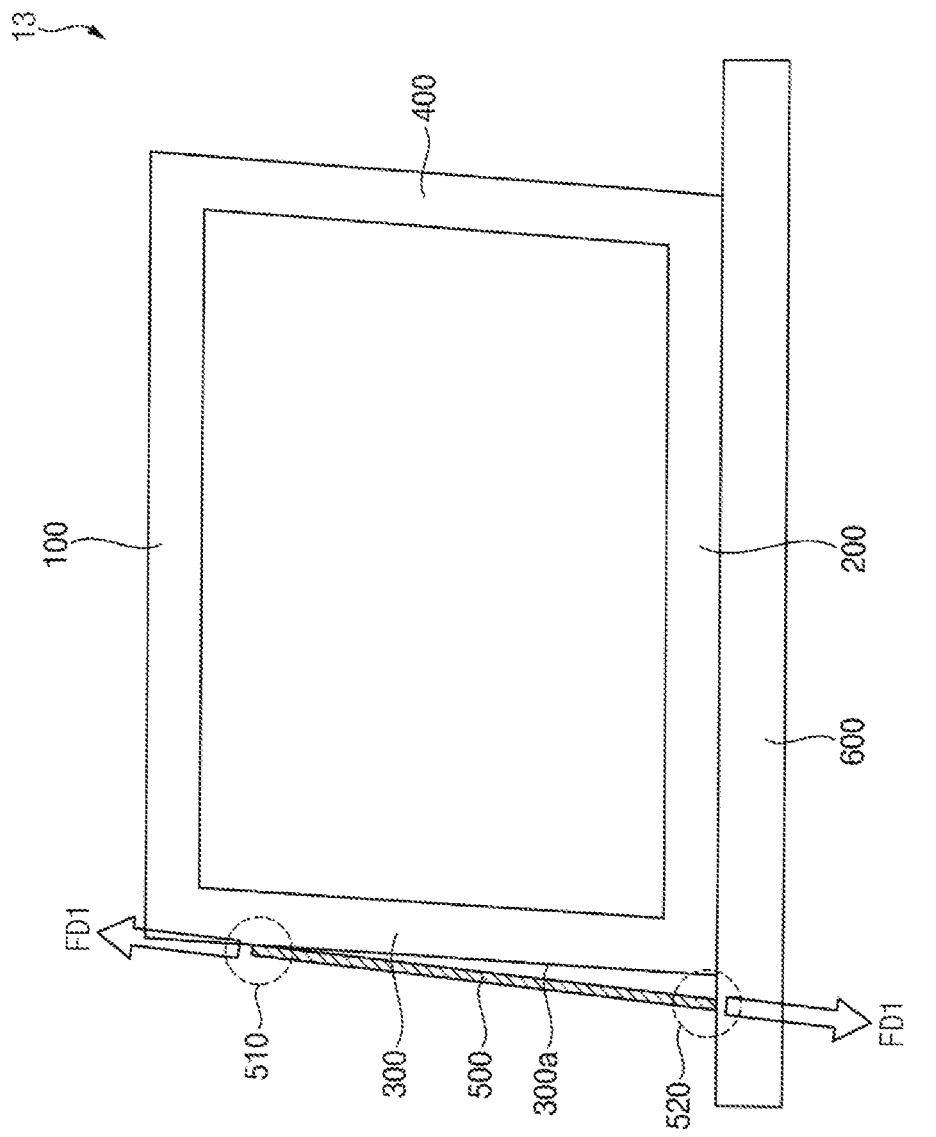
FIGS. 20, 21, and 22 are plan views showing a mask frame according to an embodiment.
Figure 21:
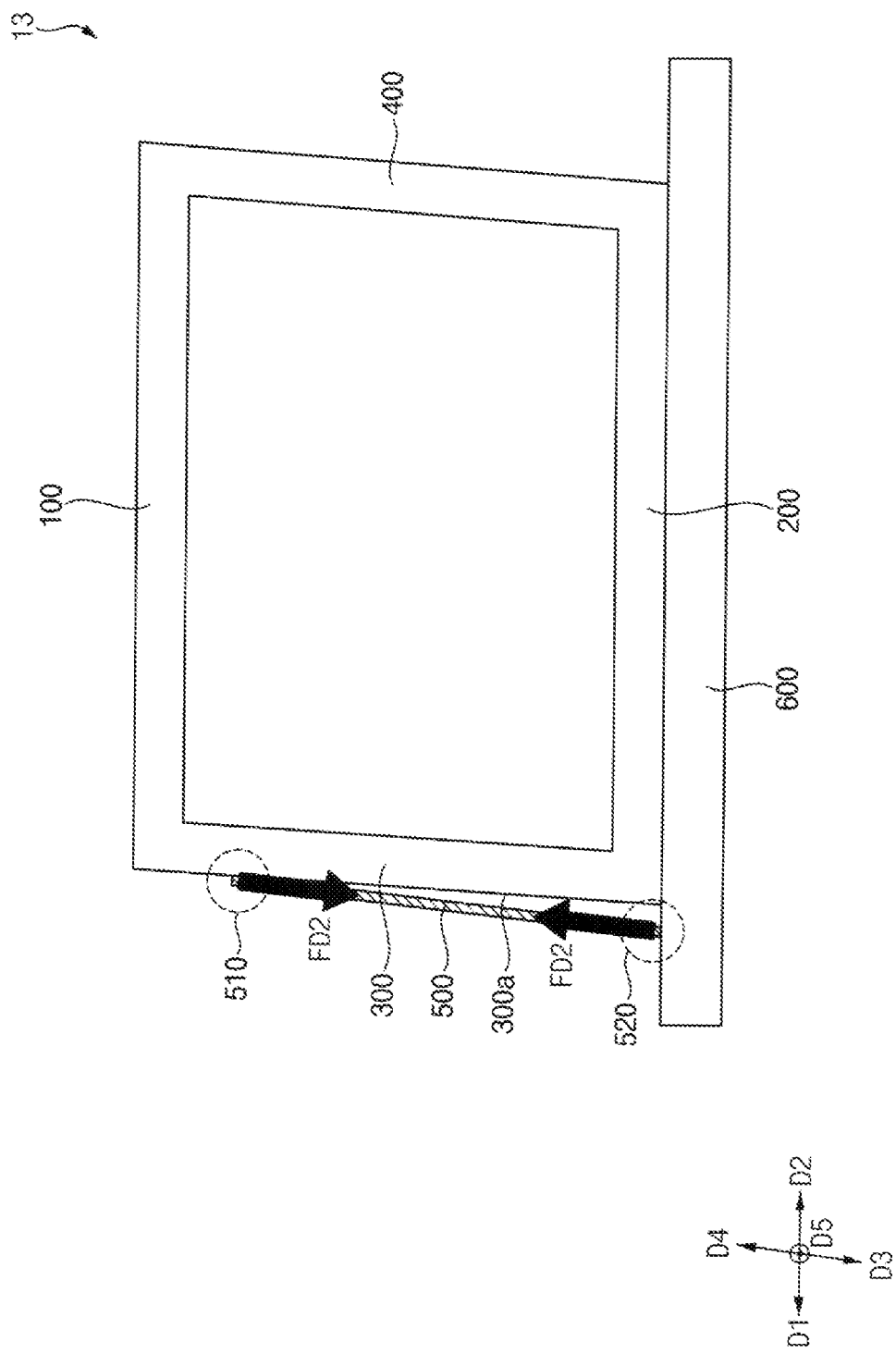
Figure 22:
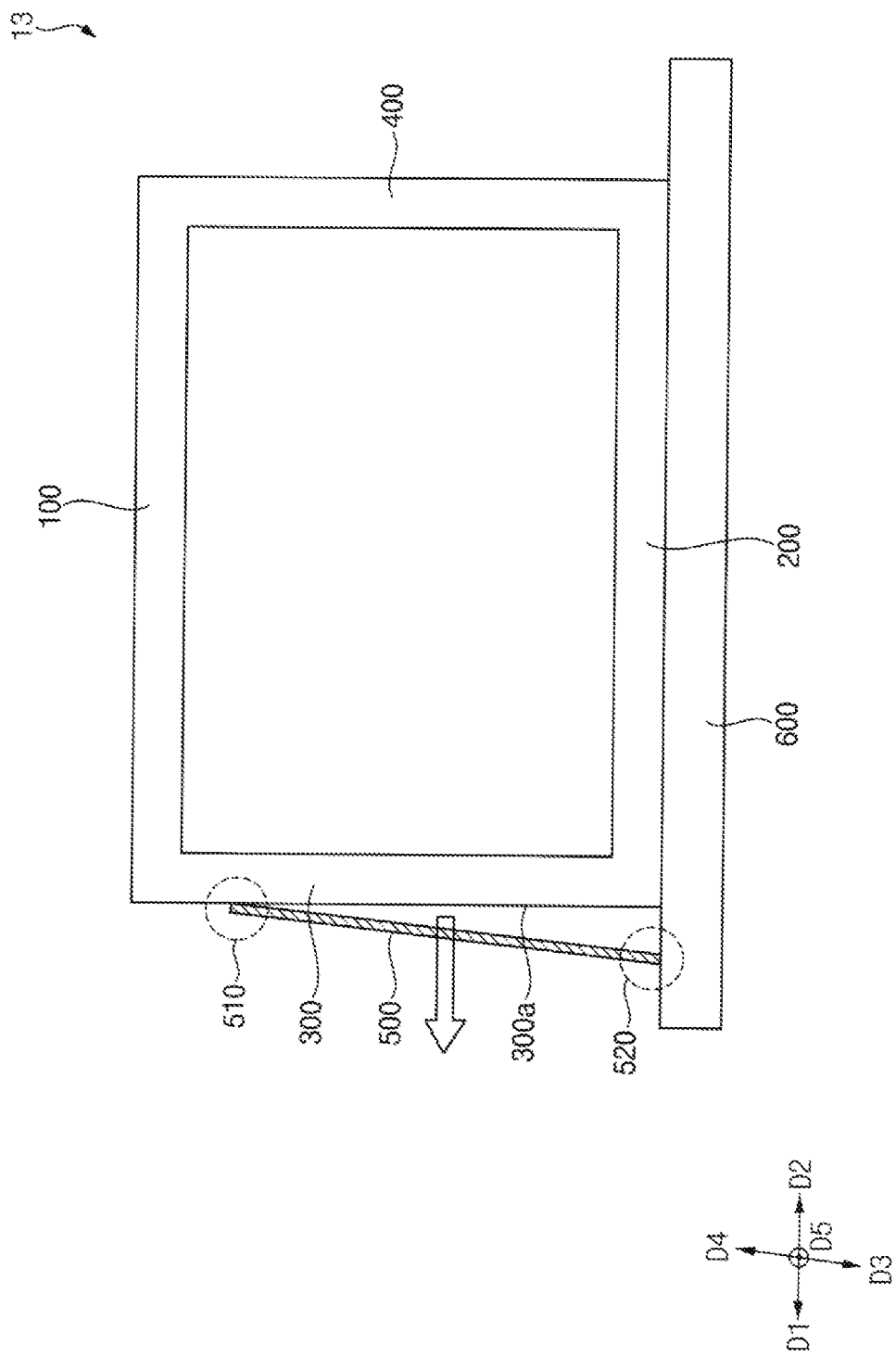

FIGS. 20 to 22 are plan views showing a mask frame according to an embodiment.

Referring to FIGS. 20 to 22, a mask frame 13 may include a first horizontal portion 100, a second horizontal portion 200, a first vertical portion 300, a second vertical portion 400, a tensile bar 500, and a stage 600.

The tensile bar 500 may be coupled to the stage 600 and one of the first vertical portion 300 and the second vertical portion 400. For example, the tensile bar 500 may be coupled to a first surface 300a of the first vertical portion 300 and an upper surface of the stage 600.

The tensile bar 500 may include a first end region 510 rigidly attached (i.e., welded, glued or attached by the mechanical connection unit (e.g., a loop)) to the first surface 300a of the first vertical portion 300 and a second end region 520 welded to the stage 600. That is, the first end region 510 may refer to a portion of the tensile bar 500 rigidly attached (i.e., welded, glued or attached by the mechanical connection unit (e.g., a loop)) to the first surface 300a of the first vertical portion 300. The second end region 520 may refer to a portion of the tensile bar 500 rigidly attached (i.e., welded, glued or attached by the mechanical connection unit (e.g., a loop)) to the stage 600. The first end region 510 may be defined as a portion adjacent to a first short side of the tensile bar 500. The second end region 520 may be defined as a portion adjacent to a second short side of the tensile bar 500 and opposite to the first end region 510. The first end region 510 of the tensile bar 500 may be fixed to the first surface 300a of the first vertical portion 300 by welding, and the second end region 520 may be fixed to the stage 600 by welding.

The mask assembly may include a mask frame 13 and a mask (not shown). When the tensile bar 500 is not attached, the mask assembly may be deformed. In detail, the first vertical portion 300 and the second vertical portion 400 may be inclined in the direction D2 due to a defect occurring in the manufacturing process. In order to compensate for the above problem, one end of the tensile bar 500 may be attached to the first surface 300a of the first vertical portion 300 in a stretched state. In addition, the other end of the tensile bar 500 may be attached to the stage 600 in a stretched state. When the tensile bar 500 contracts, the contraction force FD2 may be generated. The tensile bar 500 may apply the contraction force FD2 to the first vertical portion 300 and the stage 600 in the longitudinal directions D3 and D4 of the tensile bar 500. The process of attaching the one end of the tensile bar 500 to the first surface 300a of the first vertical portion 300 and attaching the other end of the tensile bar 500 to the stage 600 may be performed to erect the inclined first and second vertical portions 300 and 400 by inducing the deformation in the direction D1 opposite to the direction D2.

Referring to FIG. 20, the tensile bar 500 may be stretchable. Specifically, the tensile bar 500 may be subject to the tensile force FD1 in the longitudinal directions D3 and D4 of the tensile bar 500. The tensile bar 500 may be attached to the first surface 300a of the first vertical portion 300 in a stretched state by receiving the tensile force FD1.

In the tensile bar 500, the first end region 510 corresponding to the one end of the tensile bar 500 and the second end region 520 corresponding to the other end of the tensile bar 500 may be subject to the tensile force FD1. In order to cancel the bending deformation, the first end region 510 and the second end region 520 may be subject to the same tensile force FD1 in the longitudinal directions D3 and D4 of the tensile bar 500, respectively. In detail, the first end region 510 may be subject to the tensile force FD1 in the D4 direction. The second end region 520 may be subject to the tensile force FD1, which is the same as the tensile force applied to the first end region 510, in the direction D3. The first end region 510 may be rigidly attached (i.e., welded, glued or attached by the mechanical connection unit (e.g., a loop)) to the first surface 300a of the first vertical portion 300 in a stretched state by receiving the tensile force FD1. The second end region 520 may be rigidly attached (i.e., welded, glued or attached by the mechanical connection unit (e.g., a loop)) to the stage 600 in a stretched state by receiving the tensile force FD1.

Referring to FIG. 21, after the tensile bar 500 has been rigidly attached (i.e., welded, glued or attached by the mechanical connection unit (e.g., a loop)), the tensile force FD1 applied to the first end region 510 and the second end region 520 may disappear. When the tensile force FD1 disappears, the tensile bar 500 may contract to return to the original state thereof. The contraction force FD2 may be generated in the tensile bar 500. The direction of the contraction force FD2 may be opposite to the direction of the tensile force FD1. The first end region 510 may be subject to the contraction force FD2 in the direction D3, and the second end region 520 may be subject to the contraction force FD2 in the direction D4.

When the contraction force FD2 is generated in the tensile bar 500, the contraction force FD2 may be applied to the first vertical portion 300 coupled to the first end region 510 of the tensile bar 500. The first end region 510 rigidly attached (i.e., welded, glued or attached by the mechanical connection unit (e.g., a loop)) to the first vertical portion 300 and the second end region 520 rigidly attached (i.e., welded, glued or attached by the mechanical connection unit (e.g., a loop)) to the stage 600 may apply the contraction force FD2 to the first surface 300a of the first vertical portion 300. The first end region 510 may apply the contraction force FD2 in the direction D3 to the first surface 300a of the first vertical portion 300 adjacent to the first end region 510. The second end region 520 may apply the contraction force FD2 in the direction D4 to the stage 600 adjacent to the second end region 520.

Referring to FIG. 22, when the first surface 300a of the first vertical portion 300 is subject to the contraction force FD2, the inclination of the first vertical portion 300 may be adjusted by the contraction force FD2. In detail, the stage 600 adjacent to the second end region 520 may not be deformed because the stage 600 is fixed to the floor, and the upper portion of the first vertical portion 300 adjacent to the first end region 510 may be deformed because the upper portion of the first vertical portion 300 is not fixed. That is, the deformation may occur in the direction D1 at the upper portion of the first vertical portion 300. Accordingly, the deformation inclined in the direction D2 of the first vertical portion 300 and the deformation erected in the direction D1 of the first vertical portion 300 may be canceled. As a result, the inclination of the first vertical portion 300 may be corrected. In addition, since the first vertical portion 300 and the second vertical portion 400 are connected to the first horizontal portion 100, the inclination of the second vertical portion 400 may also be corrected.

Figure 24:
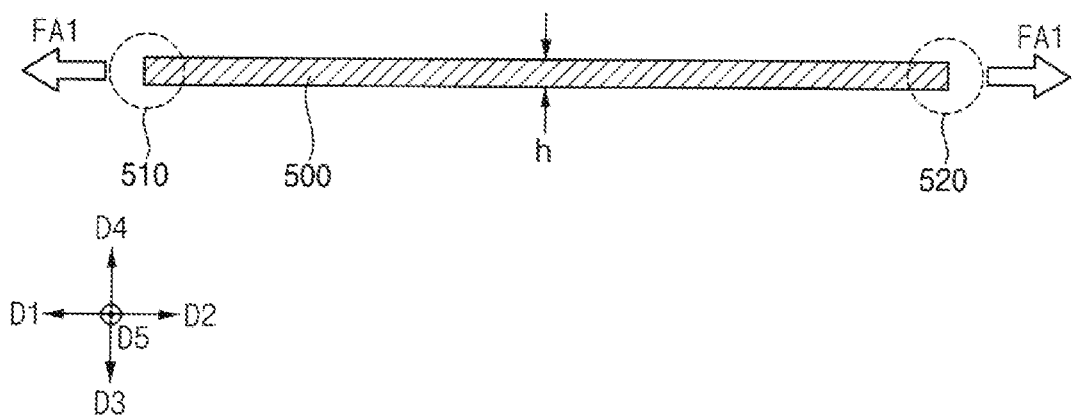

FIGS. 23 and 24 are plan views showing a method of manufacturing a mask frame according to an embodiment.

Referring to FIG. 23, a frame unit 20 may be prepared. The frame unit 20 may include a first horizontal portion 100, a second horizontal portion 200, a first vertical portion 300, a second vertical portion 400, and a stage 600. First, the stage 600 may be formed. The first horizontal portion 100, the second horizontal portion 200, the first vertical portion 300, and the second vertical portion 400 may be formed on the stage 600. A driving unit for moving the frame unit 20 may be formed on the stage 600.

The second horizontal portion 200 may be formed on the stage 600. Subsequently, the first vertical portion 300 may be connected to one end of the second horizontal portion 200. The second vertical portion 400 may be spaced apart from the first vertical portion 300, and may be connected with the other end of the second horizontal portion 200. Finally, the first horizontal portion 100 may be formed above the second horizontal portion 200 and may be connected with the first vertical portion 300 and the second vertical portion 400. The lower surface 110 of the first horizontal portion 100 may be parallel to the upper surface of the stage 600.

The first horizontal portion 100 may be subject to the bending deformation in the downward direction D3 due to the gravity and weight of the mask. Therefore, the amount (δ1) of bending deformation may be measured before the bending deformation is corrected. The amount (δ1) of bending deformation may be measured automatically by using a camera. In addition, the amount (δ1) of bending deformation may be manually measured by an operator. The direction of the bending deformation may be measured as well as the amount (δ1) of bending deformation of the first horizontal portion 100. Referring to FIG. 23, it is measured that the first horizontal portion 100 is deformed in the direction D3 by an amount (δ1) of bending deformation. The amount (δ1) of bending deformation may be defined as a distance between a point when the first horizontal portion 100 is in a straight state without the bending deformation and a point when the first horizontal portion 100 is bent farthest.

Referring to FIG. 24, the tensile force FA1 may be applied to the tensile bar 500 in the longitudinal directions D1 and D2 of the tensile bar 500. The tensile force FA1 may be applied to the tensile bar 500 to compensate for the amount 61 of the bending deformation. The tensile force FA1 may be applied in the longitudinal directions D1 and D2 of the tensile bar 500 while holding the first end region 510 and the second end region 520 of the tensile bar 500, respectively. That is, in order to compensate for the amount (δ1) of the bending deformation in the downward direction D3 of the first horizontal portion 100, the substantially same amount (δ1) of the bending deformation may be required in the upward direction D4. The required tensile force FA1 may be calculated by using the measured amount (δ1) of bending deformation That is, the tensile force FA1 having a strength capable of causing the bending deformation in the upward direction D4 may be applied to the tensile bar 500. In other words, the size of the tensile force FA1 may be determined according to the bending deformation. For example, when the amount (δ1) of bending deformation is relatively high, the tensile force FA1 applied to the tensile bar 500 in the longitudinal directions D1 and D2 of the tensile bar 500 may be relatively great. As the tensile force FA1 increases, the bending deformation in the upward direction D4 may increase. Accordingly, the tensile force FA1 according to the measured amount (δ1) of bending deformation may be determined.

Referring again to FIGS. 4 and 5, the tensile bar 500 may be coupled to the first horizontal portion 100. Specifically, the tensile bar 500 may be coupled to the first horizontal portion 100 in a state in which the tensile force FA1 is applied to the tensile bar 500. The first end region 510 and the second end region 520 may be fixedly attached (i.e., welded, glued or attached by the mechanical connection unit (e.g., a loop)) to the lower surface 110 of the first horizontal portion 100. In one embodiment, the tensile bar 500 may be coupled to the first horizontal portion 100. However, embodiments of the invention are not limited thereto, and for example, the tensile bar 500 may be coupled to the first vertical portion 300 and the second vertical portion 400.

After the tensile bar 500 has been rigidly attached (i.e., welded, glued or attached by the mechanical connection unit (e.g., a loop)) to the first horizontal portion 100, the tensile force FA1 applied to the first end region 510 and the second end region 520 may disappear. When the tensile force FA1 disappears, the tensile bar 500 may contract to return to the original state thereof. That is, the contraction force FA2 may be generated in the tensile bar 500.

When the contraction force FA2 is generated in the tensile bar 500, the contraction force FA2 may be applied to the first horizontal portion 100 coupled to the tensile bar 500. The first end region 510 and the second end region 520 fixedly attached (i.e., welded, glued or attached by the mechanical connection unit (e.g., a loop)) to the first horizontal portion 100 may apply the contraction force FA2 to the lower surface 110 of the first horizontal portion 100. The first end region 510 may apply the contraction force FA2 in the direction D2 to the lower surface 110 of the first horizontal portion 100 adjacent to the first end region 510. The second end region 520 may apply the contraction force in the direction D1 to the lower surface 110 of the first horizontal portion 100 adjacent to the second end region 520.

Referring to FIG. 6, when the lower surface 110 of the first horizontal portion 100 is subject to the contraction force FA2, the central portion of the first horizontal portion 100 may be deformed in the upward direction D4 by the contraction force FA2. That is, the bending deformation may occur at the first horizontal portion 100 in the upward direction D4. However, when the tensile bar 500 is coupled to the first horizontal portion 100, the bending deformation of the first horizontal portion 100 may be canceled. That is, the first horizontal portion 100 may have a linear shape where the bending is not generated or slightly generated.

For example, in FIG. 23, if the amount ($\delta1$) of bending deformation in the first horizontal portion 100 to which the tensile bar 500 is not coupled is measured as to about 40 μm, the amount ($\delta1$) of bending deformation in the first horizontal portion 100 coupled with the tensile bar 500 may be measured as to about 4 μm. That is, in the case of the mask frame 10 coupled with the tensile bar 500, the bending deformation may be improved to about 1/10 level. Although the amount ($\delta1$) of bending deformation may not be perfectly set to zero, if the bending deformation is improved to a level of 1/10, the deposition quality may not be significantly affected by the bending deformation. Therefore, the deposition quality may be improved during the deposition process for forming the light emitting layer by using the mask frame 10.

The tensile bar 500 may include a material having high yield strength. When plastic deformation occurs in the tensile bar 500, the tensile bar 500 may not be restored to the original state even if the tensile force FA1 applied to the tensile bar 500 disappears. That is, the tensile bar 500 may be permanently deformed. Therefore, in order to prevent the plastic deformation from occurring in the tensile bar 500, the tensile bar 500 may include a material having high yield strength. For example, a material having high yield strength may refer to a metal. When the tensile force FA1 less than the yield strength of the metal is applied to the tensile bar 500, the plastic deformation may not occur in the tensile bar 500. That is, when the tensile force FA1 disappears, the tensile bar 500 may be restored to the original state, and the contraction force FA2 may be generated in the tensile bar 500.

The tensile bar 500 may have a thickness h in the range of about 50 μm to about 2 mm. When the thickness h of the tensile bar 500 exceeds about 2 mm, the tensile force FA1 may not be easily adjusted when the tensile force FA1 for canceling the bending deformation of the first horizontal portion 100 is applied to the tensile bar 500. In addition, when the thickness h of the tensile bar 500 exceeds about 2 mm, the tensile bar 500 may interfere with the deposition material deposited on the light emitting layer during the deposition process that is performed by using the mask assembly. As a result, the deposition quality may be deteriorated.

When the thickness h of the tensile bar 500 is less than 50 μm, the strength of the contraction force FA2 generated in the tensile bar 500 may be relatively small. When the contraction force FA2 for restoring the tensile bar 500 to the original state occurs, if the thickness h of the tensile bar 500 is less than 50 μm, the contraction force FA2 for restoring the tensile bar 500 to the original state may be small. Thus, the contraction force FA2 may not be sufficiently applied to the first horizontal portion 100. That is, the bending deformation of the first horizontal portion 100 in the upward direction D4 due to the contraction force FA2 may be smaller than the bending deformation of the first horizontal portion 100 in the downward direction D3 so that the bending deformation of the first horizontal portion 100 may not be corrected.

Figure 25:
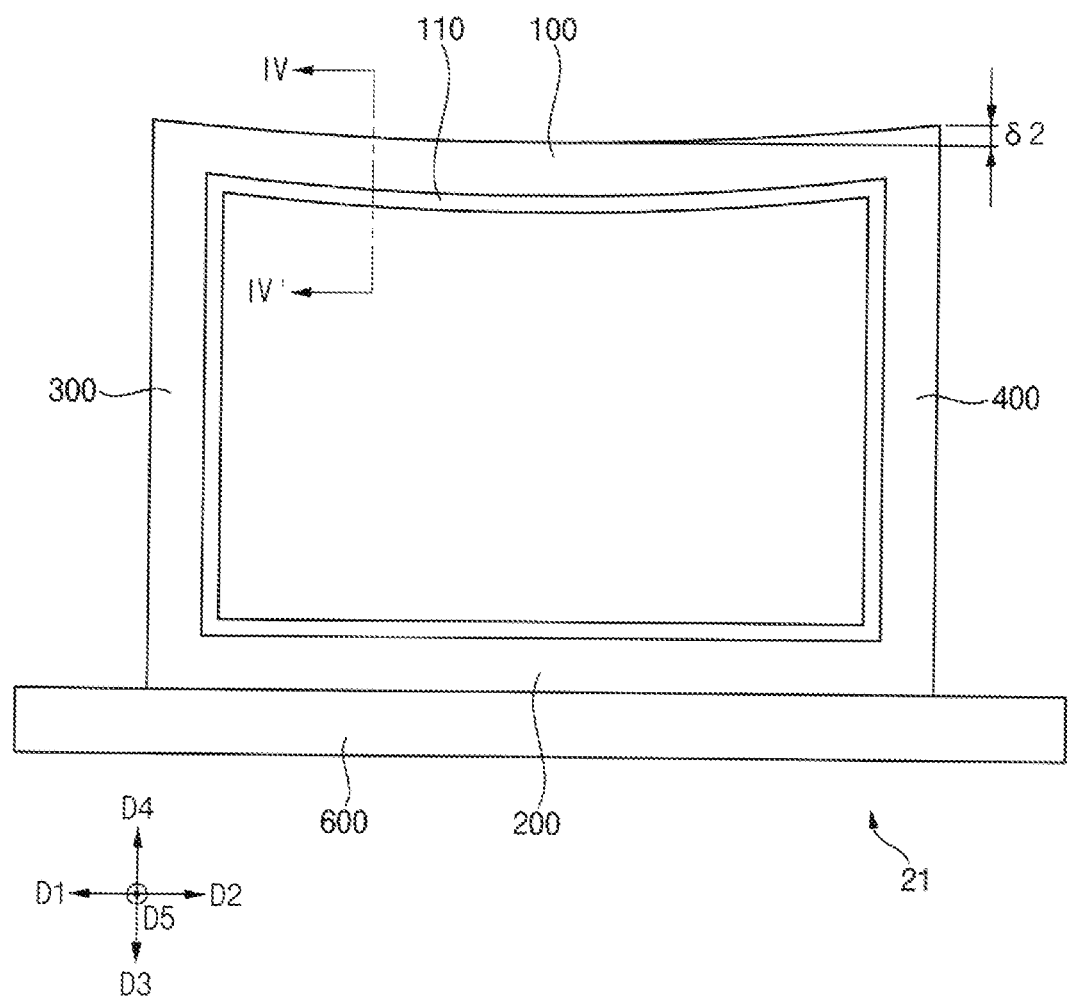
FIG. 25 is a plan view showing a method of manufacturing a mask frame according to an embodiment.
Figure 26:
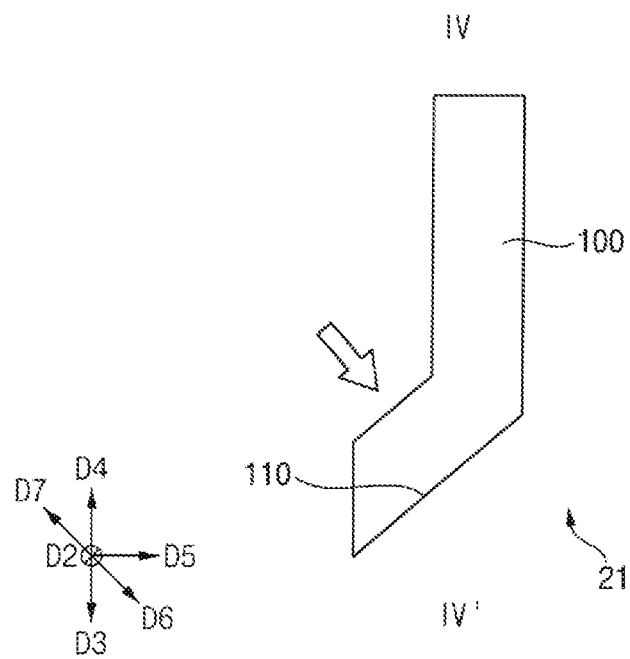
FIG. 26 is a sectional view showing a method of manufacturing a mask frame according to an embodiment.
Figure 27:
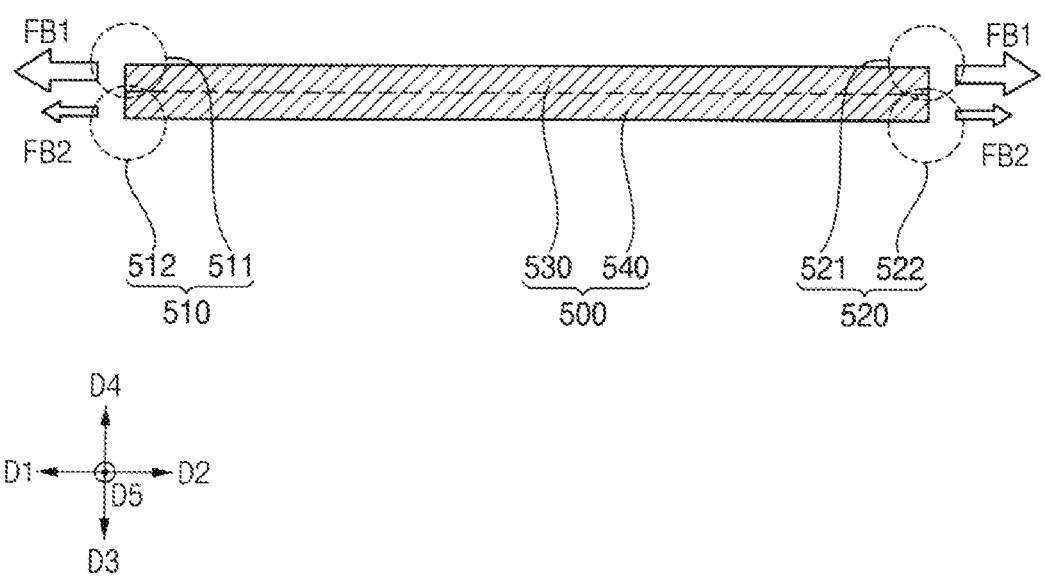
FIG. 27 is a plan view showing a method of manufacturing a mask frame according to an embodiment.

FIG. 25 is a plan view showing a method of manufacturing a mask frame according to an embodiment. FIG. 26 is a sectional view showing a method of manufacturing a mask frame according to an embodiment. FIG. 27 is a plan view showing a method of manufacturing a mask frame according to an embodiment.

Referring to FIGS. 25 and 26, the frame unit 21 may be prepared. The frame unit 21 may include the first horizontal portion 100, the second horizontal portion 200, the first vertical portion 300, the second vertical portion 400, and the stage 600. The lower surface 110 of the first horizontal portion 100 may be inclined with respect to the upper surface of the stage 600. In the method of manufacturing the mask frame described with reference to FIG. 25, the description about the processes the same as the processes of the method of manufacturing the mask frame described with reference to FIGS. 23 and 24 will be omitted below for ease in explanation of these figures.

Different from FIG. 23, in the case of FIG. 26, the lower surface 110 of the first horizontal portion 100 may be inclined with respect to the upper surface of the stage 600, and thus gravity may be applied in the directions D3 and D5. Therefore, due to the gravity and weight of the mask, the bending deformation may occur at the first horizontal portion 100 in the direction D6.

The amount ($\delta2$) of bending deformation may be measured before the bending deformation is corrected. The direction of the bending deformation may also be measured as well as the amount ($\delta2$) of bending deformation of the first horizontal portion 100. Referring to FIGS. 25 and 26, it is measured that the first horizontal portion 100 is deformed in the direction D6 by the amount ($\delta2$) of bending deformation.

Referring to FIG. 27, the tensile bar 500 may include the first region 530 and the second region 540. In one embodiment, the tensile bar 500 may include only the first region 530 and the second region 540. However, embodiments of the present invention are not limited thereto, and for example, the tensile bar 500 may include three or more regions.

The tensile forces FB1 and FB2 may be applied to the tensile bar 500 in the longitudinal directions D1 and D2 of the tensile bar 500. That is, the tensile forces FB1 and FB2 may be applied to the tensile bar 500 in order to compensate for the amount ($\delta2$) of bending deformation. The tensile forces FB1 and FB2 may be applied in the longitudinal directions D1 and D2 of the tensile bar 500 by holding the first end region 510 and the second end region 520 of the tensile bar 500. In this case, mutually different tensile forces may be applied to the first region 530 and the second region 540 of the tensile bar 500. The first end region 510 may include an upper portion 511 of the first end region 510 positioned in the first region 530 and a lower portion 512 of the first end region 510 positioned in the second region 540. The second end region 520 may include an upper portion 521 of the second end region 520 positioned in the first region 530 and a lower portion 522 of the second end region 520 positioned in the second region 540.

In order to compensate for the amount ($\delta2$) of bending deformation in the direction D6 of the first horizontal portion 100, the substantially same amount ($\delta2$) of bending deformation may be required in the direction D7. The required tensile forces FB1 and FB2 may be calculated by using the measured amount ($\delta2$) of bending deformation. That is, the tensile forces FB1 and FB2 having a size capable of causing the bending deformation in the direction D7 may be applied to the tensile bar 500. In other words, the size of the tensile forces FB1 and FB2 may be determined according to the amount (δ2) of bending deformation. For example, when the amount (δ2) of bending deformation is relatively high, the tensile forces FB1 and FB2 applied to the tensile bar 500 in the longitudinal directions D1 and D2 of the tensile bar 500 may be relatively great. As the tensile forces FB1 and FB2 increase, the bending deformation in the direction D7 may increase. Therefore, the tensile forces FB1 and FB2 according to the measured amount δ2 of bending deformation may be determined.

Referring again to FIGS. 10 and 11, the tensile bar 500 may be coupled to the first horizontal portion 100. Specifically, the tensile bar 500 may be coupled to the first horizontal portion 100 in a state in which the tensile forces FB1 and FB3 are applied to the tensile bar 500. The first end region 510 and the second end region 520 may be fixedly attached (i.e., welded, glued or attached by the mechanical connection unit (e.g., a loop)) to the lower surface 110 of the first horizontal portion 100. After the tensile bar 500 has been fixedly attached (i.e., welded, glued or attached by the mechanical connection unit (e.g., a loop)) to the first horizontal portion 100, the tensile forces FB1 and FB2 applied to the first end region 510 and the upper portion 521 of the second end region 520 and the first end region 510 and the lower portion 522 of the second end region 520 may disappear. When the tensile forces FB1 and FB2 disappear, the tensile bar 500 may contract to return to the original state thereof. That is, the contraction forces FB3 and FB4 may be generated in the tensile bar 500. Similar to the tensile forces FB1 and FB2, the first region 530 and the second region 540 of the tensile bar 500 may be subject to the contraction forces FB3 and FB4 having mutually different sizes. That is, the contraction force FB3 applied to the first region 530 may be greater than the contraction force FB4 applied to the second region 540.

When the contraction forces FB3 and FB4 are generated in the tensile bar 500, the contraction forces FB3 and FB4 may be applied to the first horizontal portion 100 coupled to the tensile bar 500. The first end region 510 and the second end region 520 fixedly attached (i.e., welded, glued or attached by the mechanical connection unit (e.g., a loop)) to the first horizontal portion 100 may apply the contraction forces FB3 and FB4 to the lower surface 110 of the first horizontal portion 100. The upper portion 511 of the first end region 510 and the upper portion 521 of the second end region 520 positioned in the first region 530 and the lower portion 512 of the first end region 510 and the lower portion 522 of the second end region 520 positioned in the second region 540 may apply mutually different contraction forces to the lower surface 110 of the first horizontal portion 100.

Specifically, the upper portion 511 of the first end region 510 may apply the contraction force FB3 in the direction D2 to the lower surface 110 of the first horizontal portion 100 adjacent to the first end region 510. The upper portion 521 of the second end region 520 may apply the contraction force FB3 in the direction D1 to the lower surface 110 of the first horizontal portion 100 adjacent to the second end region 520. The lower portion 512 of the first end region 510 may apply the contraction force FB4 in the direction D2 to the lower surface 110 of the first horizontal portion 100 adjacent to the first end region 510. The lower portion 522 of the second end region 520 may apply the contraction force FB4 in the direction D1 to the lower surface 110 of the first horizontal portion 100 adjacent to the second end region 520.

Referring to FIGS. 12 and 13, when the lower surface 110 of the first horizontal portion 100 is subject to the contraction forces FB3 and FB4, the central portion of the first horizontal portion 100 may be deformed in the direction D7 by the contraction forces FB3 and FB4. That is, the bending deformation may occur at the first horizontal portion 100 in the direction D7. When the tensile bar 500 is coupled to the first horizontal portion 100, the bending deformation of the first horizontal portion 100 may be canceled. That is, the first horizontal portion 100 may have a linear shape where the bending is not generated or slightly generated.

For example, in FIG. 25, if the amount (δ2) of bending deformation of the first horizontal portion 100 to which the tensile bar 500 is not coupled is measured as to about 40 μm, the amount (δ2) of bending deformation of the first horizontal portion 100 coupled with the tensile bar 500 may be measured as to about 4 mm. That is, in the case of the mask frame 11 coupled with the tensile bar 500, the bending deformation may be improved to about ¹⁄₁₀ level. Although the amount (δ2) of bending deformation cannot be perfectly set to zero, if the bending deformation is improved to a level of ¹⁄₁₀, the deposition quality may not be significantly affected by the bending deformation. Therefore, the deposition quality may be improved during the deposition process for forming the light emitting layer by using the mask frame 12.

Figure 28:
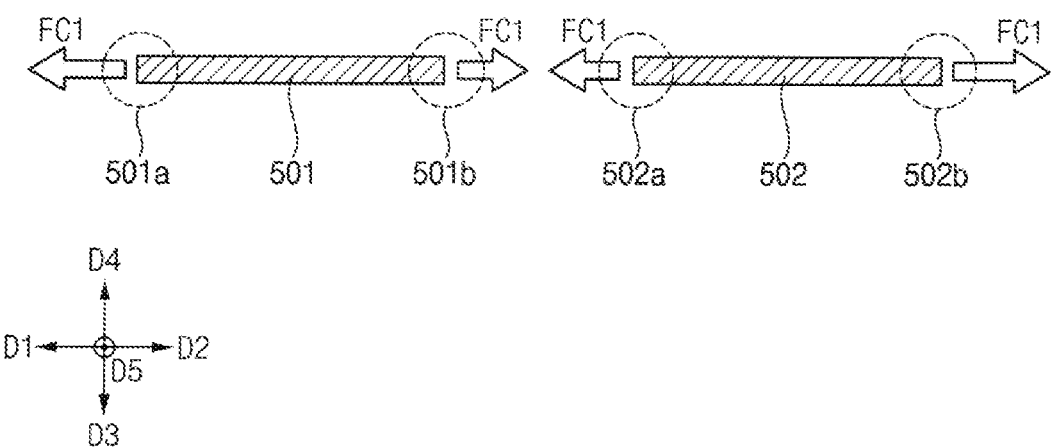
FIG. 28 is a plan view showing a method of manufacturing a mask frame according to an embodiment.

FIG. 28 is a plan view showing a method of manufacturing a mask frame according to an embodiment.

Referring to FIGS. 23 and 28, the frame unit 20 may be prepared. The frame unit 20 may include the first horizontal portion 100, the second horizontal portion 200, the first vertical portion 300, the second vertical portion 400, and the stage 600. The lower surface 110 of the first horizontal portion 100 may be parallel to the upper surface of the stage 600. The tensile bar 500 may include a first tensile bar 501 and a second tensile bar 502. The first tensile bar 501 may include one end region 501a and the other end region 501b fixedly attached (i.e., welded, glued or attached by the mechanical connection unit (e.g., a loop)) to the upper surface 120 of the first horizontal portion 100. Similarly, the second tensile bar 502 may include one end region 502a and the other end region 502b fixedly attached (i.e., welded, glued or attached by the mechanical connection unit (e.g., a loop)) to the upper surface 120 of the first horizontal portion 100.

The first horizontal portion 100 may be subject to the bending deformation in the downward direction D3 due to the gravity and the weight of the mask. Therefore, the amount (δ1) of bending deformation may be measured before the bending deformation is corrected. The direction of the bending deformation may also be measured as well as the amount (δ1) of bending deformation of the first horizontal portion 100. Referring to FIG. 23, it is measured that the first horizontal portion 100 is deformed in the direction D3 by the amount (δ1) of bending deformation.

The tensile force FC1 may be applied to each of the first tensile bar 501 and the second tensile bar 502 in the longitudinal directions D1 and D2 of the tensile bar 500. In order to compensate for the amount (δ1) of bending deformation, the tensile force FC1 may be applied to the first tensile bar 501 and the second tensile bar 502. The tensile force FC1 may be applied in the longitudinal directions D1 and D2 of the tensile bar 500 by holding one end regions 501a and 502a of the first tensile bar 501 and the second tensile bar 502 and the other end regions 501b and 502b of the first tensile bar 501 and the second tensile bar 502. That is, in order to compensate for the amount (δ1) of bending deformation in the downward direction D3 of the first horizontal portion 100, the substantially same amount (δ1)

of bending deformation may be required in the upward direction D4. The required tensile force FC1 may be calculated by using the measured amount (δ1) of bending deformation. That is, the tensile force FC1 having a size capable of causing the bending deformation in the upward direction D4 may be applied to the tensile bar 500. In other words, the size of the tensile force FC1 may be determined according to the amount (δ1) of bending deformation. For example, when the amount (δ1) of bending deformation is relatively high, the tensile force FC1 applied to the tensile bar 500 in the longitudinal directions D1 and D2 of the tensile bar 500 may be relatively great. As the tensile force FC1 increases, the bending deformation in the upward direction D4 may increase. Accordingly, the tensile force FC1 according to the measured amount (δ1) of bending deformation may be determined.

Referring again to FIGS. 17 and 18, the first tensile bar 501 and the second tensile bar 502 may be coupled to the first horizontal portion 100. The first tensile bar 501 and the second tensile bar 502 may be arranged in the longitudinal directions D1 and D2 of the first horizontal portion 100. Specifically, the first tensile bar 501 and the second tensile bar 502 may be coupled to the first horizontal portion 100 in a state in which the tensile force FC1 is applied to the first tensile bar 501 and the second tensile bar 502. One end regions 501a and 502a and the other end regions 501b and 502b of the first tensile bar 501 and the second tensile bar 502 may be fixedly attached (i.e., welded, glued or attached by the mechanical connection unit (e.g., a loop)) to the upper surface 120 of the first horizontal portion 100. After the first tensile bar 501 and the second tensile bar 502 have been fixedly attached (i.e., welded, glued or attached by the mechanical connection unit (e.g., a loop)) to the first horizontal portion 100, the tensile force FC1 applied to the first tensile bar 501 and the second tensile bar 502 may disappear. When the tensile force FC1 disappears (i.e., is no longer applied), the first tensile bar 501 and the second tensile bar 502 may contract to return to the original state thereof. That is, the contraction force FC2 may be generated in the first tensile bar 501 and the second tensile bar 502.

When the contraction force FC2 is generated in the first tensile bar 501 and the second tensile bar 502, the contraction force FC2 may be applied to the first horizontal portion 100 coupled to the tensile bar 500. The one end regions 501a and 502a and the other end regions 501b and 502b of the first tensile bar 501 and the second tensile bar 502 fixedly attached (i.e., welded, glued or attached by the mechanical connection unit (e.g., a loop)) to the first horizontal portion 100 may apply the contraction force FC2 to the upper surface 120 of the first horizontal portion 100. The one end regions 501a and 502a of the first tensile bar 501 and the second tensile bar 502 may apply the contraction force FC2 in the direction D2 to the upper surface 120 of the first horizontal portion 100 adjacent to the one end regions 501a and 502a. The other end regions 501b and 502b of the first tensile bar 501 and the second tensile bar 502 may apply the contraction force FC2 in the direction D1 to the upper surface 120 of the first horizontal portion 100 adjacent to the other end regions 501b and 502b.

Referring to FIG. 19, when the upper surface 120 of the first horizontal portion 100 is subject to the contraction force FC2, the central portion of the first horizontal portion 100 may be deformed in the upward direction D4 by the contraction force FC2. That is, the bending deformation may occur at the first horizontal portion 100 in the upward direction D4. Accordingly, when the first tensile bar 501 and the second tensile bar 502 are coupled to the first horizontal portion 100, the bending deformation of the first horizontal portion 100 may be canceled. That is, the first horizontal portion 100 may have a linear shape where the bending is not generated or slightly generated.

For example, in FIG. 23, if the amount (δ1) of bending deformation of the first horizontal portion 100 to which the tensile bar 500 is not coupled is measured as to about 40 μm, the amount (δ1) of bending deformation of the first horizontal portion 100 coupled with the first tensile bar 501 and the second tensile bar 502 may be measured as to about 4 μm. That is, in the case of the mask frame 12 coupled with the first tensile bar 501 and the second tensile bar 502, the bending deformation may be improved to about 1/10 level. Therefore, the deposition quality may be improved during the deposition process for forming the light emitting layer by using the mask frame 12.

The present invention may be applied to various mask assemblies that may have a mask frame for vapor deposition. For example, the present invention is applicable to numerous mask assemblies such as a metal mask assembly for depositing an organic light emitting layer, a metal mask assembly for depositing a thin film, and the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A mask frame comprising:
a first horizontal portion;
a second horizontal portion disposed under the first horizontal portion;
at least one vertical portion connecting the first horizontal portion and the second horizontal portion; and
a tensile bar coupled to the first horizontal portion, and
wherein the tensile bar is configured to apply a contraction force to the first horizontal portion in a longitudinal direction of the tensile bar.

2. The mask frame of claim 1, wherein the tensile bar is coupled to a lower surface of the first horizontal portion.

3. The mask frame of claim 1, wherein a first end region of the tensile bar and a second end region of the tensile bar opposite to the first end region are rigidly attached to the first horizontal portion.

4. The mask frame of claim 1, wherein the tensile bar includes a first region and a second region applying a contraction force having a strength different from a strength of a contraction force applied from the first region.

5. The mask frame of claim 1, wherein the tensile bar includes metal.

6. The mask frame of claim 1, wherein the tensile bar has a thickness in a range of about 50 μm to about 2 mm.

7. The mask frame of claim 1, wherein the tensile bar includes a first tensile bar and a second tensile bar, wherein the first tensile bar has a same material structure as the second tensile bar.

8. The mask frame of claim 7, wherein the first tensile bar and the second tensile bar are arranged in a longitudinal direction of the first horizontal portion.

9. The mask frame of claim 7, wherein the first tensile bar and the second tensile bar are coupled to an upper surface of the first horizontal portion.

10. A mask frame comprising:
a first horizontal portion;

a second horizontal portion disposed under the first horizontal portion;

at least one vertical portion connecting the first horizontal portion and the second horizontal portion; and a first tensile bar coupled to a first part of the first horizontal portion;

a second tensile bar coupled to a second part of the first horizontal portion that is different than the first part, wherein the first tensile bar is spaced apart from the second tensile bar with respect to a cross sectional view of the mask frame such that a gap exists between the first tensile bar and the second tensile bar, wherein a tensile force of the first tensile bar and a tensile force of the second tensile bar are such that a first edge of the first tensile bar and a first edge of the second tensile bar are urged to move in a direction towards each other, and wherein the tensile force of the first tensile bar and the tensile force of the second tensile bar are such that a second edge of the first tensile bar opposite the first edge of the first tensile bar, and a second edge of the second tensile bar opposite the first edge of the second tensile bar, are urged to move in a direction away from each other.

11. The mask frame of claim 10, wherein the tensile bar includes the first tensile bar and the second tensile bar, wherein the first tensile bar has a same material structure as the second tensile bar.

* * * * *